United States Patent
Suzuki et al.

(10) Patent No.: US 8,837,884 B2
(45) Date of Patent: Sep. 16, 2014

(54) OPTICAL SEMICONDUCTOR DEVICE, AND MANUFACTURING METHOD THEREOF

(75) Inventors: Takanori Suzuki, Tokyo (JP); Takafumi Taniguchi, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 124 days.

(21) Appl. No.: 13/490,806

(22) Filed: Jun. 7, 2012

(65) Prior Publication Data

US 2012/0321244 A1 Dec. 20, 2012

(30) Foreign Application Priority Data

Jun. 15, 2011 (JP) .................. 2011-133575

(51) Int. Cl.
| | |
|---|---|
| G02B 6/26 | (2006.01) |
| G02B 6/42 | (2006.01) |
| H01S 5/10 | (2006.01) |
| G02B 6/30 | (2006.01) |
| G02B 6/122 | (2006.01) |
| H01S 5/0625 | (2006.01) |
| H01S 5/227 | (2006.01) |
| H01S 5/026 | (2006.01) |
| H01S 5/30 | (2006.01) |
| G02B 6/12 | (2006.01) |

(52) U.S. Cl.
CPC ........... H01S 5/1014 (2013.01); H01S 5/06256 (2013.01); H01S 5/2275 (2013.01); G02B 6/305 (2013.01); G02B 6/1228 (2013.01); H01S 5/026 (2013.01); H01S 5/3054 (2013.01); G02B 2006/12176 (2013.01); H01S 5/1032 (2013.01)
USPC .................... 385/43; 385/27; 385/31; 385/39

(58) Field of Classification Search
CPC ..................................... G02B 6/1228
USPC .......................................................... 385/43
See application file for complete search history.

(56) References Cited

FOREIGN PATENT DOCUMENTS

JP 09-102651 A 4/1997

OTHER PUBLICATIONS

Machine Translation of JP09-102651, Apr. 1997.*
Lealman et al., "1.56 µm InGaAsP/InP tapered active layer multiquantum well laser with improved coupling to cleaved singlemode fibre", Electronics Letters, 1994, pp. 857-859, vol. 30, No. 11.
Moerman et al., "A Review on Fabrication Technologies for the Monolithic Integration of Tapers with III-V Semiconductor Devices", IEEE Journal of Selected Topics in Quantum Electronics, Dec. 1997, vol. 3, No. 6.

(Continued)

*Primary Examiner* — Ryan Lepisto
(74) *Attorney, Agent, or Firm* — Mattingly & Malur, PC

(57) ABSTRACT

The optical semiconductor device includes a spot-size converter formed on a semiconductor substrate. The spot-size converter has a multilayer structure including a light transition region. The multilayer structure includes a lower core layer, and an upper core layer having a refractive index higher than that of the lower core layer. The width of the upper core layer is gradually decreased and the width of the lower core layer is gradually increased in the light transition region. Both sides and an upper side of the multilayer structure are buried by a semi-insulating semiconductor layer in the light transition region. Light incident from one end section of the spot-size converter is propagated to the upper core layer. The light transits from the upper core layer to the lower core layer in the light transition region, is propagated to the lower core layer, and exits from the other end section thereof.

9 Claims, 10 Drawing Sheets

(56) References Cited

OTHER PUBLICATIONS

Suzuki et al., "Wide-tuning (65nm) Semi-cooled (50° C.) Operation of a Tunable Laser based on a Novel Widely Tunable Filter", Optical Fiber Communication Conference 2011, OWD7, 2011.
Öberg et al., "74 nm Wavelength Tuning Range of an InGaAsP/InP Vertical Grating Assisted Codirectional Coupler Laser with Rear Sampled Grating Reflector", IEEE Photonics Technology Letters, Jul. 1993, vol. 5, No. 7.

Ponnampalam et al., "Equivalent Performance in C- and L-Bands of Digital Supermode Distributed Bragg Reflector Lasers", IEEE Journal of Quantum Electronics, Sep. 2007, vol. 43, No. 9.

* cited by examiner

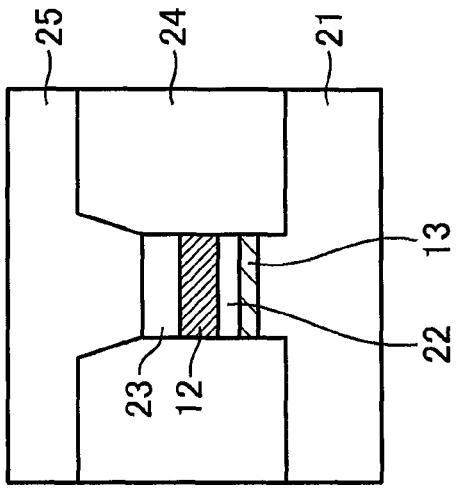
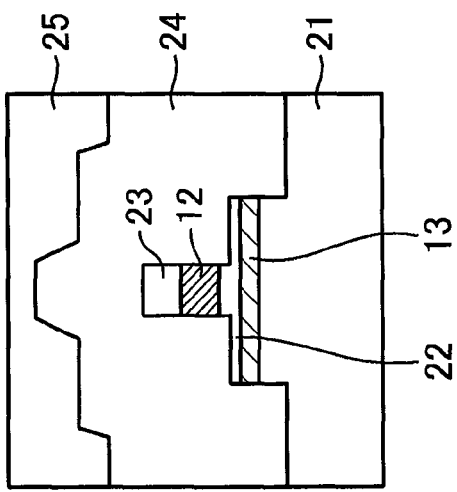
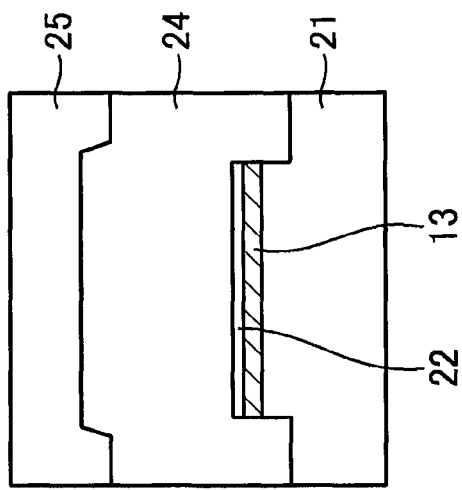

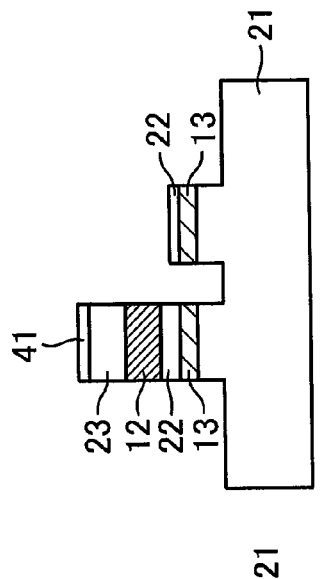
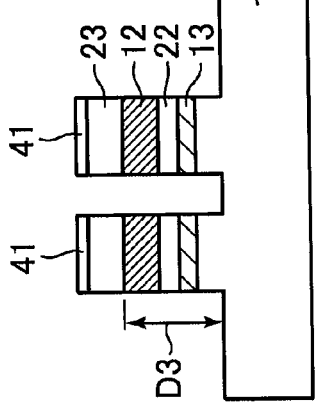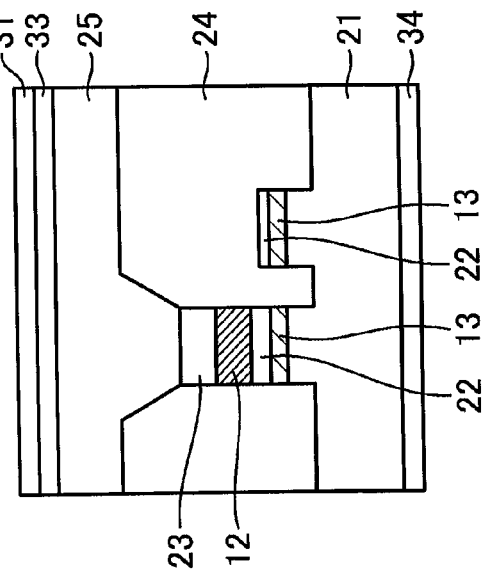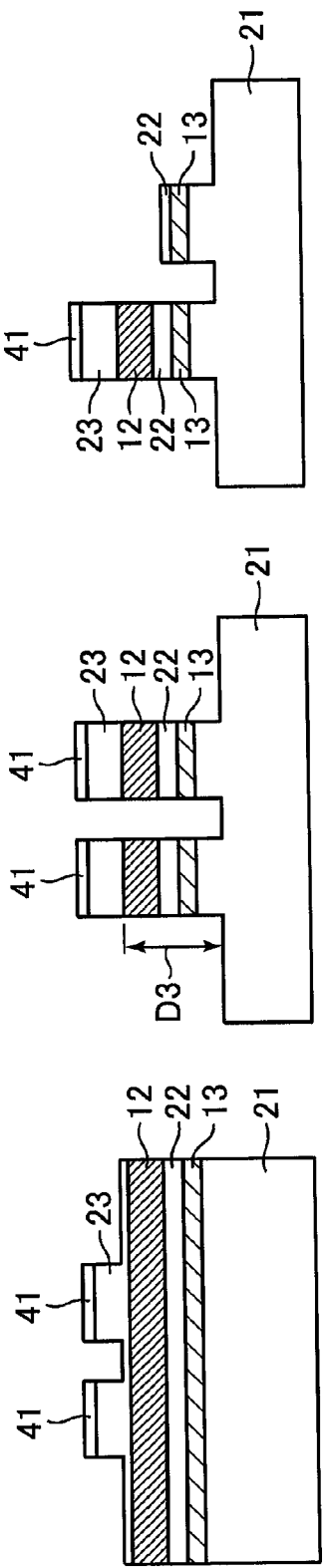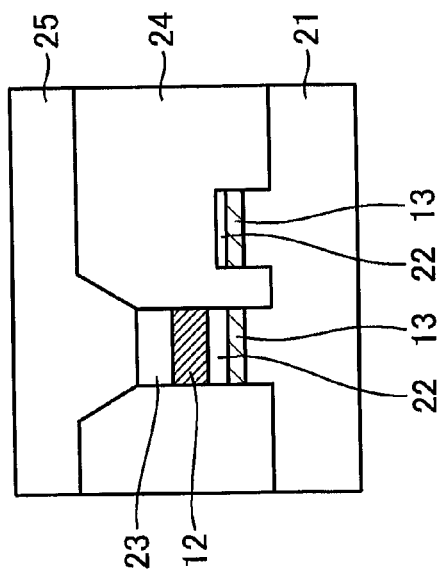

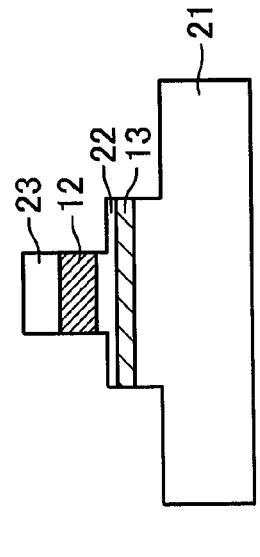
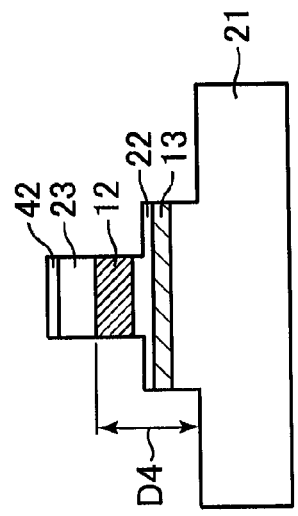
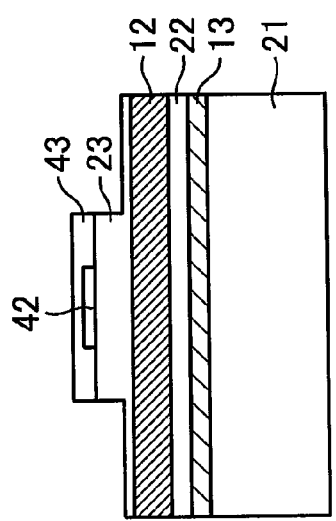
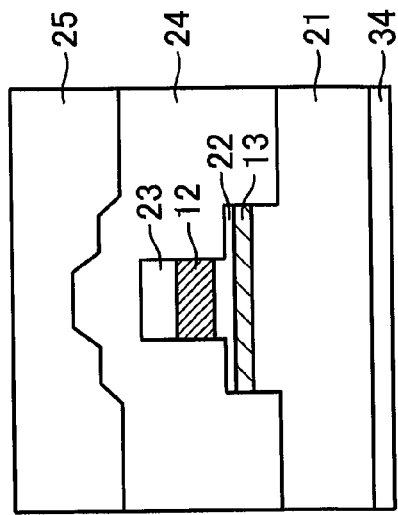
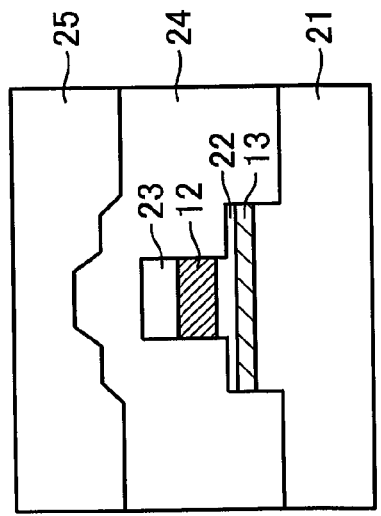

PRIOR ART

OPTICAL SEMICONDUCTOR DEVICE, AND MANUFACTURING METHOD THEREOF

CROSS-REFERENCE TO RELATED APPLICATION

The present application claims priority from Japanese application JP 2011-133575 filed on Jun. 15, 2011, the content of which is hereby incorporated by reference into this application.

BACKGROUND OF THE INVENTION

1. Field of the Invention

The present invention relates to an optical semiconductor device, and a manufacturing method thereof.

2. Description of the Related Art

For example, an optical fiber is connected to a laser module having a semiconductor laser device. In this case, it is important to efficiently couple laser light emitted from the laser module to the optical fiber. With regard to an emission surface of a semiconductor laser device, in the case where optical confinement in an optical waveguide is strong, the far field pattern (hereinafter, referred to as FFP) of the laser light is widened, and a coupling efficiency with respect to the optical fiber is decreased. Further, in a case where the optical confinement in the optical waveguide is strong in one of a longitudinal direction and a transverse direction, and is weak in the other thereof, the FFP accordingly has an elliptical shape which is wide in one direction and is narrow in the other direction, and thus, the coupling efficiency with respect to the optical fiber which has a circular cross-sectional shape is decreased. Thus, it is desirable to adjust the FFP to have a shape which is moderately narrow and is close to a circle by moderately alleviating the optical confinement in the optical waveguide and by allowing the optical confinement to have similar strengths in the longitudinal and transverse directions.

In order to alleviate the optical confinement in the optical waveguide and adjust the FFP of the semiconductor laser device, a spot-size converter is used. For example, "Electronics Letters, vol. 30, No. 11, pp 857-859, 1994" and "Journal of Selected Topics in Quantum Electronics, vol. 3, No. 6, pp 1308-1320, 1997" disclose a semiconductor laser device which includes a mesa width tapered spot-size converter. FIG. 12 is a diagram schematically illustrating a structure of a mesa width tapered spot-size converter in the related art. The rear surface in the figure corresponds to an incident surface of laser light, and the front surface therein corresponds to an emission surface of the laser light. In a case where a semiconductor laser device has a buried hetero-structure (hereinafter, referred to as a BH structure), the spot-size converter is disposed on the emission side of the semiconductor laser device, and the spot-size converter has a tapered structure in which the mesa width of a mesa stripe structure included in a core layer 112, decreases along an emission direction of the laser light. Due to the BH structure in which both sides of the mesa stripe structure are buried in a buried layer, the periphery of the core layer 112 having such a shape is surrounded by a clad layer 111. Since the light confined in the core layer 112 is leaked to the peripheral clad layer 111 as the mesa width is decreased, a mode field of the light propagating in a waveguide may be widened in a longitudinal direction and also in a transverse direction, and the FFP may be narrowed in a longitudinal direction and also in a transverse direction.

Further, "Journal of Selected Topics in Quantum Electronics, vol. 3, No. 6, pp 1308-1320, 1997" discloses a semiconductor laser device which includes a thick film tapered spot-size converter. FIG. 13 is a diagram schematically illustrating a structure of a thick film tapered spot-size converter in the related art. In a similar way to FIG. 12, the front surface in the figure corresponds to an emission surface of laser light, and the periphery of a core layer 112 is surrounded by a clad layer 111. The spot-size converter shown in FIG. 13 has a tapered structure in which the thickness of the core layer 112 is gradually decreased along an emission direction. Since the light confined in the core layer 112 is leaked to the peripheral clad layer 111 as the layer thickness is decreased (the layer becomes narrow), a mode field of the light may be widened and the FFP may be narrowed, in a similar way to the spot-size converter shown in FIG. 12.

Further, for example, JP09-102651 A and "Journal of Selected Topics in Quantum Electronics, vol. 3, No. 6, pp 1308-1320, 1997" disclose a dual mesa tapered spot-size converter which includes a two-layered core layer having an upper core layer and a lower core layer. The refractive index of the upper core layer is higher than the refractive index of the lower core layer, and the mesa width of the upper core layer is decreased along an emission direction of laser light, in a similar way to the core layer 112 shown in FIG. 12. On the other hand, the mesa width of the lower core layer is increased along the emission direction of the laser light. On the incident side of the spot-size converter, the confinement of light is strong in the upper core layer of which the refractive index is high, and the light transits from the upper core layer to the lower core layer as the mesa width of the upper core layer is decreased. Since the refractive index of the lower core layer is lower than the refractive index of the upper core layer, the confinement of the light transited to the lower core layer becomes weak, and on the emission side of the spot-size converter, the mode field of the light may be widened and the FFP may be narrowed.

SUMMARY OF THE INVENTION

Since the mode field of the light in the emission surface of the spot-size converter depends on the shape of the core layer 112, the distance from the tip end of the core layer 112 to the emission surface of the laser light, and the like in the mesa width tapered spot-size converter and the thick film tapered spot-size converter, it is necessary to control the shape, the distance and the like with high accuracy. In particular, in a manufacturing process of the thick film tapered spot-size converter, when the selective growth effect using a dielectric mask is used in crystal growth of the core layer 112, it is difficult to control the mask shape or growth conditions. On the other hand, in the dual mesa tapered spot-size converter, since the mode field of the light in the emission surface mainly depends on the refractive index, the mesa width and the film thickness of the lower core layer, the dual mesa tapered spot-size converter is desirable in view of controllability of the spot size of the laser light.

In general, an insertion loss of the spot-size converter which occurs when the spot-size converter is disposed may be classified into a transition loss when the mode field is converted and a propagation loss which occurs in waveguide propagation. In the dual mesa tapered spot-size converter, when a region where the light transits from the upper core layer to the lower core layer is referred to as a light transition region and the length of the light transition region is represented as L, the propagation loss [dB] in the light transition region of the dual mesa tapered spot-size converter is expressed as $-10 \Log \{\exp(-\alpha L)\}$ (Formula 1). Here, $\alpha$ [cm$^{-1}$] represents loss per unit length.

As indicated by Formula 1, since the propagation loss is decreased as L is decreased, it is desirable that L is short as much as possible from the viewpoint of decreasing the propagation loss. However, if the length L of the light transition region is short (the light transition region is small), the mode conversion from the upper core layer to the lower core layer becomes stiff, and the transition loss is increased. In order to decrease the transition loss, it is desirable that the mode conversion is smooth. That is, in the light transition region, it is desirable that the mesa width of the upper core layer is gradually decreased and the mesa width of the lower core layer is gradually increased along the emission direction. If the mode conversion is smooth, the transition loss is small to such a degree that it can be ignored. Thus, from the viewpoint of reducing the transition loss, it is desirable that the length L of the light transition region is long (the light transition region is large), and thus, there is a limit to decrease in the length L of the light transition region.

Thus, in order to decrease the insertion loss of the spot-size converter in the predetermined length L of the light transition region, it is necessary to decrease a which is the loss per unit length and to decrease the propagation loss, as indicated by Formula 1. A technique which decreases the device length of the spot-size converter is disclosed in JP09-102651 A, but a technique which decreases the loss a per unit length is neither disclosed nor suggested therein.

The present invention has been made in consideration of these circumstances, and an object thereof is to provide an optical semiconductor device which includes a spot-size converter improved in a conversion characteristic through a structure which suppresses propagation loss in a light transition region, and a manufacturing method thereof.

(1) According to a first aspect of the invention, there is provided an optical semiconductor device including a spot-size converter formed on a semiconductor substrate. The spot-size converter has a multilayer structure including a light transition region. The multilayer structure is formed by layering plural layers including a lower core layer and an upper core layer having a refractive index higher than that of the lower core layer. The width of the upper core layer is gradually decreased and the width of the lower core layer is gradually increased along an emission direction of light in a light transition region. Both sides and an upper side of the multilayer structure are buried by a semi-insulating semiconductor layer in the light transition region. Light incident from one end surface the spot-size converter is propagated to the upper core layer, transits from the upper core layer to the lower core layer in the light transition region, is propagated to the lower core layer, and exits from the other end surface the spot-size converter.

(2) In the optical semiconductor device described in (1), the semiconductor substrate may be an n-type, and the multilayer structure (the plural layers) may include a first p-type semiconductor clad layer which is formed on an upper side of the upper core layer, and a second p-type semiconductor clad layer which is formed on an upper side of the semi-insulating semiconductor layer in the light transition region.

(3) The optical semiconductor device described in (2) may further include a wavelength selection filter having a first mesa stripe structure which is disposed on an optical axis of light incident on the spot-size converter and a second mesa stripe structure which is formed in parallel to the lateral side of the first mesa stripe structure and being integrated on the semiconductor substrate monolithically. The first mesa stripe structure may include a first core layer which is formed of the same composition as that of the upper core layer of the spot-size converter, and the second mesa stripe structure may include a second core layer which is formed of the same composition as that of the lower core layer of the spot-size converter. An upper surface of the second mesa stripe structure may be lower than a lower surface of the first core layer.

(4) In the optical semiconductor device described in (3), a lower surface of the semi-insulating semiconductor layer disposed on both sides of the multilayer structure in the light transition region of the spot-size converter and a lower surface of the semi-insulating semiconductor layer disposed on both sides of the first mesa stripe structure of the wavelength selection filter may have the same height.

(5) The optical semiconductor device described in (2) may further include a semiconductor laser device which includes a mesa stripe structure including an active layer which is in contact with the upper core layer may be integrated on the semiconductor substrate monolithically, and the thickness of semiconductor layer which is layered on the upper side of the upper core layer of the spot-size converter may be larger than the thickness of semiconductor layer which is layered on an upper side of the active layer of the semiconductor laser device.

(6) The optical semiconductor device described in (2) may further include a wavelength selection filter which changes the refractive index of an optical waveguide by electric current to control a wavelength to be selected may be integrated on the semiconductor substrate monolithically.

(7) In the optical semiconductor device described in (6), the wavelength selection filter may select the wavelength of light by light transition which occurs between a first core layer which is formed of the same composition as that of the upper core layer of the spot-size converter and a second core layer which is formed of the same composition as that of the lower core layer of the spot-size converter.

(8) In the optical semiconductor device described in (7), a second wavelength selection filter having a selection wavelength band which is narrower than a selection wavelength band of the wavelength selection filter, a gain section which emits light, and a phase adjusting section which adjusts the phase of light may be integrated on the semiconductor substrate monolithically.

(9) In the spot-size converter described in (2), the semiconductor substrate, the semi-insulating semiconductor layer, the first semiconductor clad layer and the second semiconductor clad layer may be formed of an InP-based material.

(10) In the optical semiconductor device in (2), zinc may be added to the first semiconductor clad layer as a dopant, and ruthenium may be added to the semi-insulating semiconductor layer as a dopant.

(11) According to a second aspect of the invention, there is provided a manufacturing method of an optical semiconductor device including a spot-size converter formed on a semiconductor substrate and having a multilayer structure including a light transition region. The multilayer structure is formed by layering plural layers which includes a lower core layer and an upper core layer having a refractive index higher than that of the lower core layer. The width of the upper core layer is gradually decreased and the width of the lower core layer is gradually increased along an emission direction of light in the light transition region. Light incident from one end surface the spot-size converter is propagated to the upper core layer, transits from the upper core layer to the lower core layer in the light transition region, is propagated to the lower core layer, and exits from the other end section the spot-size converter. The method may include: a dual mesa forming process, which includes an upper mesa mask forming process which forms an upper mesa mask corresponding to the shape of the upper core layer on the upper surface of the multilayer including the lower core layer and the upper core layer, and forms the upper core layer and the lower core layer in a predetermined shape; an upper mesa mask removing process of removing a portion of the upper mesa mask corresponding to the light transition region at least; and a burying process of burying the multilayer by a semi-insulating semiconductor layer so that the semi-insulating semiconductor layer is formed on both sides and an upper side of the multilayer in the light transition region.

(12) In the manufacturing method of the optical semiconductor described in (11), the multilayer structure (the plural layers) may further include a first p-type semiconductor clad layer on an upper side of the upper core layer and the method further include: a clad layer forming process of layering a second p-type semiconductor clad layer after the burying process.

(13) In the manufacturing method of the optical semiconductor device described in (11), the dual mesa forming process may further include: a lower mesa mask forming process of forming a lower mesa mask which is formed of a material different from that of the upper mask on an upper side of the upper mesa mask, corresponding to the shape of the lower core layer; a first etching process of etching the periphery of the lower mesa mask down to a predetermined depth for removal, using the lower mesa mask as a mask; a lower mesa mask removing process of removing the lower mesa mask; and a second etching process of etching the periphery of the upper mesa mask for removal from an upper surface of the multilayer structure to between the upper core layer and the lower core layer and further etching a region etched down to the predetermined depth in the first etching process for removal down to a depth which is lower than the lower core layer for removal, using the upper mesa mask as a mask.

(14) In the manufacturing method of the optical semiconductor device described in (11), the dual mesa forming process may further include: a lower mesa mask forming process of forming a lower mesa mask on an upper surface of the multilayer structure, corresponding to the shape of the lower core layer; a first etching process of etching the periphery of the lower mesa mask for removal from an upper surface of the multilayer structure down to a depth which is lower than the lower core layer, using the lower mesa mask as a mask; and a second etching process of etching the periphery of the upper mesa mask for removal from the upper surface of the multilayer structure to between the upper core layer and the lower core layer, and the upper mesa mask may be formed by removing a part of the lower mesa mask, in the upper mesa mask forming process.

(15) In the manufacturing method of the optical semiconductor device described in (12), the optical semiconductor device may further include a semiconductor laser device having a mesa stripe structure and being integrated on the semiconductor substrate monolithically. The multilayer of the spot-size converter and both sides of the mesa stripe structure of the semiconductor laser device may be buried by the semi-insulating semiconductor layer, in the burying process. The second p-type semiconductor clad layer may be layered on and the multilayer structure of the spot-size converter and an upper side of the mesa stripe structure of the semiconductor laser device, in the clad layer forming process.

(16) In the manufacturing method of the optical semiconductor device described in (13), the optical semiconductor device may further include a wavelength selection filter having a first mesa stripe structure which is disposed on an optical axis of light incident on the spot-size converter and a second mesa stripe structure which is formed in parallel to the lateral side of the first mesa stripe structure and being integrated on the semiconductor substrate monolithically. The first mesa stripe structure may include a first core layer which is formed of the same composition as that of the upper core layer of the spot-size converter, the second mesa stripe structure may include a second core layer which is formed of the same composition as that of the lower core layer of the spot-size converter, and an upper surface of the second mesa stripe structure may be lower than a lower surface of the first core layer. A process of etching the peripheries of a first mesa mask and a second mesa mask which are respectively formed corresponding to the first mesa stripe structure and the second mesa stripe structure of the wavelength selection filter, down to a depth which is lower than the second core layer may be performed for removal by etching in the first etching process and the second etching process.

(17) In the manufacturing method of the optical semiconductor device described in (14), the optical semiconductor device may further include a wavelength selection filter having a first mesa stripe structure which is disposed on an optical axis of light incident on the spot-size converter and a second mesa stripe structure which is formed in parallel to the lateral side of the first mesa stripe structure and being integrated on the same semiconductor substrate monolithically. The first mesa stripe structure may include a first core layer which is formed of the same composition as that of the upper core layer of the spot-size converter, the second mesa stripe structure may include a second core layer which is formed of the same composition as that of the lower core layer of the spot-size converter, and an upper surface of the second mesa stripe structure may be lower than a lower surface of the first core layer. A process of etching the peripheries of a first mesa mask and a second mesa mask which are respectively formed corresponding to the first mesa stripe structure and the second mesa stripe structure of the wavelength selection filter, down to a depth which is lower than the second core layer may be performed for removal by etching in the first etching process, and a process of etching a portion disposed on an upper side of the second mesa stripe structure down to an upper surface of the second mesa stripe structure may be performed for removal by etching in the second etching process.

According to the invention, there are provided an optical semiconductor device which includes a spot-size converter improved in a conversion characteristic through a structure which suppresses propagation loss in a light transition region, and a manufacturing method thereof.

BRIEF DESCRIPTION OF THE DRAWINGS

FIG. 2B is a cross-sectional view illustrating the spot-size converter according to the first embodiment of the invention.

FIG. 2C is a cross-sectional view illustrating the spot-size converter according to the first embodiment of the invention.

FIG. 2D is a cross-sectional view illustrating the spot-size converter according to the first embodiment of the invention.

FIG. 7A is a cross-sectional view illustrating a manufacturing process of the integrated semiconductor laser device according to the third embodiment of the invention.

FIG. 7B is a cross-sectional view illustrating a manufacturing process of the integrated semiconductor laser device according to the third embodiment of the invention.

FIG. 7C is a cross-sectional view illustrating a manufacturing process of the integrated semiconductor laser device according to the third embodiment of the invention.

FIG. 7D is a cross-sectional view illustrating a manufacturing process of the integrated semiconductor laser device according to the third embodiment of the invention.

FIG. 7E is a cross-sectional view illustrating a manufacturing process of the integrated semiconductor laser device according to the third embodiment of the invention.

FIG. 8A is a cross-sectional view illustrating a manufacturing process of the integrated semiconductor laser device according to the third embodiment of the invention.

FIG. 8B is a cross-sectional view illustrating a manufacturing process of the integrated semiconductor laser device according to the third embodiment of the invention.

FIG. 8C is a cross-sectional view illustrating a manufacturing process of the integrated semiconductor laser device according to the third embodiment of the invention.

FIG. 8D is a cross-sectional view illustrating a manufacturing process of the integrated semiconductor laser device according to the third embodiment of the invention.

FIG. 8E is a cross-sectional view illustrating a manufacturing process of the integrated semiconductor laser device according to the third embodiment of the invention.

DETAILED DESCRIPTION OF THE INVENTION

Figure 1:
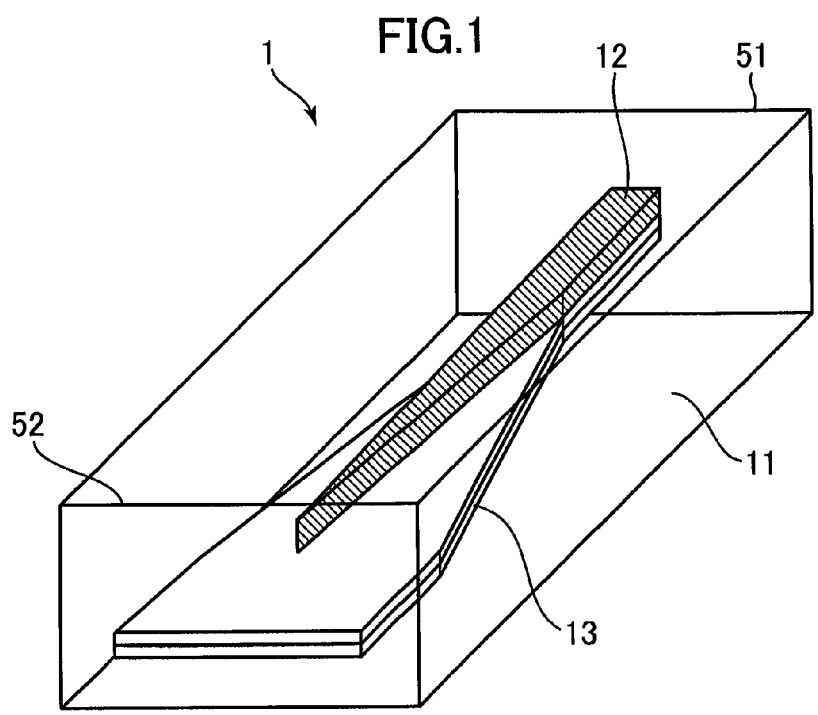
FIG. 1 is a schematic diagram illustrating a structure of a spot-size converter according to a first embodiment of the invention.

Hereinafter, embodiments according to the invention will be described in detail. Here, drawings in the following description illustrate examples of respective embodiments, and the size of each drawing and the scale used in the present example are not necessarily matched with each other. In the drawings shown below, the same reference signs are given to members having the same function, and its repetitive description will be omitted. In the following embodiments, description about the same or similar sections will not be repeated as a rule except for a particularly necessary case.

First Embodiment

FIG. 1 is a schematic diagram illustrating a structure of a spot-size converter 1 according to a first embodiment of the invention. The spot-size converter 1 is a dual mesa tapered spot-size converter, as shown in FIG. 1. The spot-size converter 1 has a multilayer structure in which plural layers which includes an upper core layer 12 and a lower core layer 13 are layered. As described later in detail, the periphery of a two-layered core layer is surrounded by a clad layer 11. Further, in the spot-size converter 1, laser light is incident on the upper core layer 12 from a rear surface side in the figure, and the light propagated in the upper core layer 12 transits to the lower core layer 13. The spot-size converter 1 emits the laser light of which the spot size is converted, from a front surface side in the figure. That is, the rear surface shown in FIG. 1 corresponds to an incident end surface 51 and the front surface corresponds to an emission end surface 52. In a light transition region, the multilayer structure is a dual mesa structure which includes an upper mesa stripe structure and a lower mesa stripe structure, and the mesa width of the upper mesa stripe structure which includes the upper core layer 12 is decreased along an emission direction of the laser light. On the other hand, the mesa width of the lower mesa stripe structure which includes the lower core layer 13 is increased along the emission direction of the laser light. The refractive index of the upper core layer 12 is higher than the refractive index of the lower core layer 13.

Figure 2A:
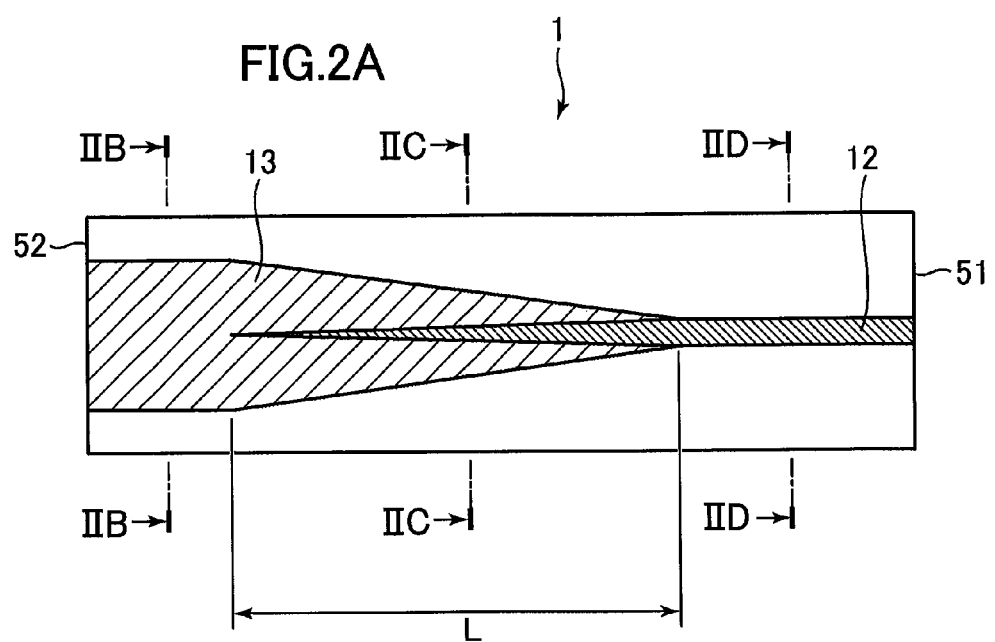
FIG. 2A is a schematic top view illustrating the structure of the spot-size converter according to the first embodiment of the invention.

FIG. 2A is a schematic top view illustrating the structure of the spot-size converter 1 according to the first embodiment. FIG. 2A schematically shows a planar overlap of the lower core layer 13 and the upper core layer 12 which is disposed above the lower core layer 13, when seen from the top of the spot-size converter 1. For ease of description, it is assumed that an incident light propagation region, a light transition region and an emission light propagation region are sequentially disposed from right to left when seen from the top of the spot-size converter 1.

As shown in FIG. 2A, along the emission direction of the laser light from the incident end surface 51 to the emission end surface 52, the upper core layer 12 extends the same width, extends while the width thereof is gradually decreased on the way, and disappears in the vicinity of the emission end surface 52. Here, the light transition region is a region which ranges from a portion where the width of the upper core layer 12 begins to become progressively narrower to where it disappears, as seen from the planar top view. The incident light propagation region is a region which ranges from the incident end surface 51 to the portion where the width of the upper core layer 12 begins to be narrow, and the emission light propagation region is a region which ranges from the tip end of the upper core layer 12 to the emission end surface 52. In FIG. 2A, the length of the light transition region is indicated as L. On the other hand, the lower core layer 13 has approximately the same width as the upper core layer 12 in the incident light propagation region along the emission direction of the laser light from the incident end surface 51 to the emission end surface 52 to extend with the same width, extends while the width thereof is gradually increased from the beginning of the light transition region, and then extends with the same width in the emission light propagation region to reach the emission end surface 52.

FIGS. 2B to 2D are cross-sectional views illustrating the spot-size converter 1 according to the first embodiment. FIG. 2B shows a cross-section taken along line IIB-IIB in FIG. 2A, FIG. 2C shows a cross-section taken along line IIC-IIC in FIG. 2A, and FIG. 2D shows a cross-section taken along line IID-IID in FIG. 2A, respectively. The cross-section shown in FIG. 2D is the same as the mesa cross-sectional view on the incident end surface 51 of the spot-size converter 1, and assumes a basic multilayer of the multilayer structure included in the spot-size converter 1, to form a BH structure.

As shown in FIG. 2D, an n-type lower core layer 13, an n-type InP etching stop layer 22, an i-type upper core layer 12, and a first p-type InP clad layer 23 (plural layers) are sequentially layered on an n-type InP substrate 21, in the incident light propagation region. A mesa stripe structure is formed from the first InP clad layer 23 which is disposed on the upper part to a part of the n-type InP substrate 21 through the upper core layer 12, the InP etching stop layer 22 and the lower core layer 13. The refractive index of the lower core layer 13 is higher than the refractive index of InP and is lower than the refractive index of the upper core layer 12. Accordingly, the n-type InP substrate 21 functions as a clad layer with respect to the two-layered core layer. Further, the thickness of the lower core layer 13 is narrower than the thickness of the upper core layer 12. Accordingly, in the mesa stripe structure, light confinement in the upper core layer 12 is stronger than light confinement in the lower core layer 13, and a main optical waveguide in which light incident from the incident end surface 51 is propagated becomes the upper core layer 12. For example, in a case where InGaAsP is used for the two-layered core layer, each core layer may be formed so that a composition wavelength of the upper core layer 12 is longer than a composition wavelength of the lower core layer 13. Here, the upper core layer 12 is an i-type in which a dopant is not intentionally added, but is not limited thereto as the spot-size converter. That is, the upper core layer 12 may be an n-type.

Both sides of the corresponding mesa stripe structure which includes the upper core layer 12 and the lower core layer 13 are buried by a semi-insulating InP buried layer 24. The refractive index of the upper core layer 12 and the refractive index of the lower core layer 13 are higher than the refractive index of the semi-insulating InP buried layer 24, and thus, the semi-insulating InP buried layer 24 functions as a clad layer with respect to the two-layered core layer. An upper surface of the semi-insulating InP buried layer 24 forms an inclined surface from the highest layer of the mesa stripe structure to be widened to the outside, and then forms a flat surface on the further outside. Further, a second p-type InP clad layer 25 is formed to cover the highest layer of the mesa stripe structure and the upper surface of the semi-insulating InP buried layer 24. Accordingly, the clad layer 11 shown in FIG. 1 is formed around the upper core layer 12 and the lower core layer 13.

As shown in FIG. 2C, in the light transition region, the multilayer structure which includes the upper core layer 12 and the lower core layer 13 becomes a structure different from the mesa stripe structure shown in FIG. 2D. That is, the multilayer structure is a dual mesa structure which includes an upper mesa stripe structure and a lower mesa stripe structure, in the light transition region. Here, the upper mesa stripe structure includes the first InP clad layer 23, the upper core layer 12 and a part of the InP etching stop layer 22, and the lower mesa stripe structure includes the remaining part of the InP etching stop 22, the lower core layer 13 and a part of the n-type InP substrate 21. In the light transition region, the mesa width of the upper mesa stripe structure which includes the upper core layer 12 is decreased along the emission direction of the laser light. On the other hand, the mesa width of the lower mesa stripe structure which includes the lower core layer 13 is increased along the emission direction of the laser light. Such a configuration is referred to as a dual mesa tapered structure. In the dual mesa tapered structure, with respect to light propagated along the emission direction of the laser light, light confinement in the upper core layer 12 is gradually weakened. As a result, the light transits from the upper core layer 12 to the lower core layers 13, and the proportion of light confined in the lower core layer 13 is gradually increased.

Both sides of the multilayer structure are buried by the semi-insulating InP buried layer 24 in a similar way to FIG. 2D, but differently from FIG. 2D, the semi-insulating InP buried layer 24 is also formed on the upper side of the multilayer structure. That is, in the light transition region, both sides and the upper side of the multilayer structure are buried by the semi-insulating InP buried layer 24. Further, the second p-type InP clad layer 25 is formed to cover the upper surface of the semi-insulating InP buried layer 24. Accordingly, the first InP clad layer 23, the semi-insulating InP buried layer 24 and the second InP clad layer 25 are sequentially layered on the upper side of the upper core layer 12.

As shown in FIG. 2B, in the emission light propagation region, the multilayer structure is configured by only the above-mentioned lower mesa stripe structure on the n-type InP substrate 21, in which the upper core layer 12 is not disposed. In the light transition region, light transits from the upper core layer 12 to the lower core layer 13, and thus, the main optical waveguide in the emission light propagation region is configured by the lower core layer 13. Here, described above, the refractive index of the lower core layer 13 is lower than the refractive index of the upper core layer 12, and the thickness of the lower core layer 13 is narrower than the thickness of the upper core layer 12. Thus, light confinement in the lower core layer 13 in the emission light propagation region is weaker than light confinement in the upper core layer 12 in the incident light propagation region, and thus, light leakage to the clad layer 11 in a longitudinal direction and a transverse direction is increased. Thus, a mode field in the emission end surface 52 is widened in the longitudinal direction and the transverse direction. Thus, it is possible to decrease the FFP of the laser light output from the spot-size converter 1.

As described above, it is preferable that the length L of the light transition region be small from the viewpoint of reducing the propagation loss, but a predetermined length is necessary for suppressing the transition loss, and thus, there is a limit to reduction of the length L. When the light transition region has the predetermined length L, in order to reduce the insertion loss of the spot-size converter 1, as shown in Formula 1, it is preferable that the spot-size converter 1 have a structure in which a loss per unit length a is reduced. When the wavelength of laser light incident on the spot-size converter 1 is 1.55 µm, if the upper core layer 12 or the lower core layer 13 in the multilayer structure of the spot-size converter 1 is formed by InGaAsP having a composition wavelength of 1.4 µm or less, for example, it can be said that absorption of light of 1.55 µm is small and the upper core layer 12 and the lower core layer 13 are almost transparent. For example, the composition wavelength of the upper core layer 12 may be 1.4 µm and the composition wavelength of the lower core layer 13 may be 1.2 µm to 1.3 µm. In such a case, the loss per unit length a is determined by inter valence band absorption (hereinafter, referred to as IVBA) in the p-type InP layer which is disposed around the core layer. Thus, in the light transition region, by disposing the semi-insulating InP buried layer 24 on the upper side in addition to both sides of the multiple layer structure in which the plural layers including the upper core layer 12 and the lower core layer 13 is layered, it is possible to keep the second p-type InP clad layer 25 which is formed on a further upper side of the semi-insulating InP buried layer 24 at a distance, and it is thus possible to suppress IVBA occurring in the second p-type InP clad layer 25.

In the light transition region of the spot-size converter 1 according to the present embodiment, in the vicinity of the upper core layer 12 and the lower core layer 13, the n-type InP substrate 21 is disposed on the lower side thereof and the semi-insulating InP buried layer 24 is disposed on both sides and the upper side above thereof. The p-type InP layer is only the first p-type InP clad layer 23 which is disposed on the upper side of the upper core layer 12. The semi-insulating InP of the semi-insulating InP buried layer 24 and the n-type InP of the n-type InP substrate 21 have a small absorption loss which is negligible. Further, since the thickness of the first p-type InP clad layer 23 is small, arrangement of the p-type InP layer which causes the absorption loss is suppressed in the vicinity of the upper core layer 12 and the lower core layer 13.

Further, similarly, in the emission light transition region, in the vicinity of the lower core layer 13, the n-type InP substrate 21 is disposed on the lower side thereof, the InP etching stop layer 22 is disposed on the upper side thereof, and the semi-insulating InP buried layer 24 is disposed on both sides and the upper side thereof, respectively, and the p-type InP layer which causes the absorption loss is not disposed, to thereby suppress the absorption loss.

As described later, the p-type semiconductor layer may be layered on the plural layers which is layered in the multilayer structure by a different manufacturing process such as a case where a device is manufactured in which the spot-size converter and an optical functional device such as a semiconductor modulator or a semiconductor wavelength-variable filter or a semiconductor laser device are integrated on the same semiconductor substrate monolithically. In such a case or the like, even in a case where the p-type semiconductor layer is disposed on the upper side of the upper core layer of the dual mesa tapered spot-size converter, the insertion loss in the spot-size converter is reduced.

In a case where the semiconductor device is formed by an InP-based material, Fe-doped InP obtained by adding Fe (copper) as a dopant is frequently used for a semi-insulating semiconductor buried layer. However, since the Fe-doped InP has a considerable mutual diffusion with Zn (zinc) used as a dopant of the p-type InP layer, Zn is diffused from the p-type InP layer to the semi-insulating InP buried layer, and thus, the light absorption loss occurs even in the semi-insulating InP layer in which Zn is diffused. Thus, it is preferable that Ru (ruthenium) which suppresses the mutual diffusion with Zn be used as the dopant of the semi-insulating semiconductor layer from the viewpoint of suppressing the absorption loss. In a case where the Ru-doped InP obtained by adding Ru as a dopant is used as the semi-insulating semiconductor buried layer, since the Zn diffusion is remarkably reduced even in a contact surface with the p-type InP, the light absorption loss in the insulating semiconductor buried layer is suppressed. In a case where the p-type InP dopant is a material different from Zn, a material having a small mutual diffusion with the corresponding dopant may be selected as a dopant of the semi-insulating InP.

In order to further reduce the propagation loss in the light transition region, the first p-type InP clad layer 23 may be removed, but it is necessary to perform a process for the removal. In the spot-size converter 1 according to the present embodiment, by remaining the first p-type InP clad layer 23 which is layered in the manufacturing method, it is possible to reduce the propagation loss in the light transition region without increase in the manufacturing process. Further, in the spot-size converter 1 according to the present embodiment, the semiconductor is manufactured using the InP-based material, but may be manufactured using other semiconductor materials.

Next, a main manufacturing process of the spot-size converter 1 according to the present embodiment will be described. Firstly, plural layers including the lower core layer 13 formed of InGaAsP, the InP etching stop layer 22, the upper core layer 12 formed of InGaAsP and the first InP clad layer 23 is sequentially layered on the n-type InP substrate 21 using molecular beam epitaxy, for example (multilayer forming process).

Subsequently, a dual mesa forming process is performed in which the multilayer formed by the multilayer forming process is formed in a predetermined shape, described above. As an example of the dual mesa forming process, firstly, a pattern mask (lower mesa mask) corresponding to the above-mentioned shape of the lower core layer 13 is formed on the upper side of the first InP clad layer 23 which is the highest layer of the multilayer, and then, side surfaces of the lower mesa stripe structure are formed by etching the first InP clad layer 23, the upper core layer 12, the InP etching stop layer 22, the lower core layer 13 and a part of the n-type InP substrate 21 using the pattern mask as a mask. Next, the lower mesa mask is removed, and then, a pattern mask (upper mesa mask) corresponding to the above-mentioned shape of the upper core layer 12 is formed on the first InP clad layer 23 (upper mesa mask forming process). Then, the upper mesa stripe structure is formed by etching the first InP clad layer 23, the upper core layer 12 and a part of the InP etching stop layer 22 using the pattern mask as a mask.

After the dual mesa forming process, a portion of the upper mesa mask which is formed in the light transition region and the emission light propagation region is removed (upper mesa mask removing process), and then, the multilayer is buried by the semi-insulating InP buried layer 24 (burying process). Without removing the upper mesa mask formed in the incident light propagation region, as shown in FIG. 2D, the semi-insulating InP buried layer 24 is formed on both sides of the multilayer, and the upper surface of the semi-insulating InP buried layer 24 forms an inclined surface to be widened to the outside and forms a flat surface on a further outside, through this upper mesa mask. On the other hand, since the upper mesa mask formed in the light transition region and the emission light propagation region is removed, as shown in FIGS. 2B and 2C, the semi-insulating InP buried layer 24 is formed on the upper side in addition to both sides of the multilayer.

Further, the upper mesa mask remaining in the incident light propagation region is removed, and the second p-type InP clad layer 25 is layered (clad layer forming process), to thereby manufacture the spot-size converter 1.

Hereinbefore, the spot-size converter 1 according to the present embodiment has been described. The dual mesa tapered structure of the spot-size converter 1 is not limited thereto, and a variety of shapes may be considered. For example, in the light transition region of the spot-size converter 1 according to the present embodiment, the portion where the width of the upper core layer 12 begins to be gradually decreased and the portion where the width of the lower core layer 13 begins to be gradually increased are the same, but may be different from each other. In this case, the incident end section in the light transition region is set to a portion where the width of the upper core layer 12 begins to be gradually decreased. Further, for example, in a case where the light transition in the light transition region is sufficient, the length of the emission light transition region may be short, and the emission end section in the light transition region may serve as the emission end surface 52 without providing the emission light transition region. In this case, it is preferable that the emission tip end of the upper core layer 12 be as narrow as possible and be designed to a manufacturing limit of the process, but the invention is not limited thereto. In these cases, in the upper mesa mask removing process, the part of the upper mesa mask corresponding to the light transition region may be similarly removed.

Second Embodiment

An optical semiconductor device according to a second embodiment of the invention is an integrated semiconductor laser device 2 in which a spot-size converter section 3 and a gain section 4 of semiconductor laser are integrated on the same semiconductor substrate. Here, the semiconductor laser is a Fabry-Perot type laser having a band of 1.55 µm, and an InGaAsP-based material is used for a multiple quantum well layer 32.

Figure 3A:
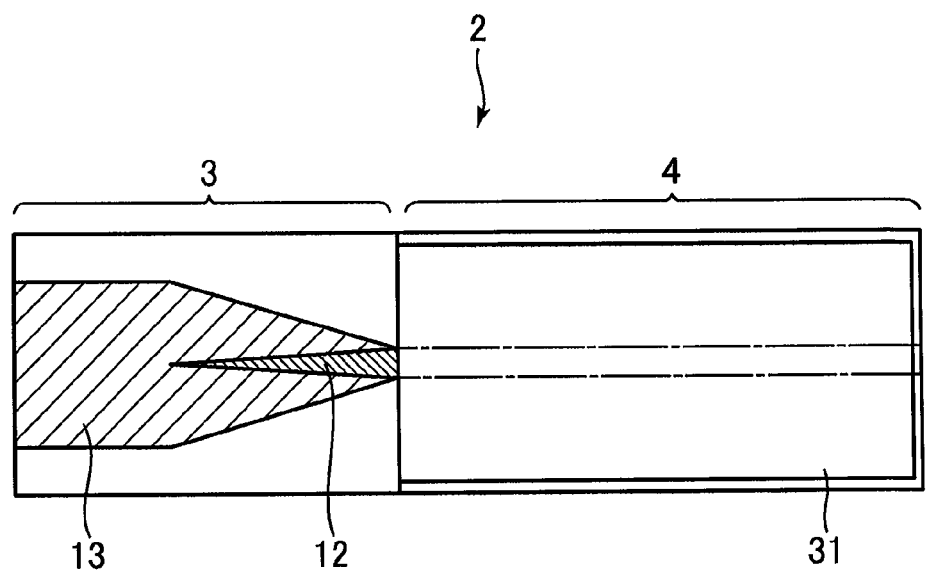
FIG. 3A is a schematic top view illustrating a structure of an integrated semiconductor laser device according to a second embodiment of the invention.

FIG. 3A is a schematic top view illustrating a structure of the integrated semiconductor laser device 2 according to the second embodiment of the invention. FIG. 3A schematically shows a planar overlap in the spot-size converter 3 including the lower core layer 13 and the upper core layer 12 which is disposed above the lower core layer 13, when seen from the top of the integrated semiconductor laser device 2. Further, a p-type electrode 31 formed on an upper surface of the gain section 4 is shown, and an optical waveguide in the gain section 4 is schematically shown.

A structure of the spot-size converter section 3 is basically the same as that of the spot-size converter 1 according to the first embodiment, but an incident light propagation region is considerably decreased compared with that of the spot-size converter 1 according to the first embodiment, or is not be provided.

Figure 3B:
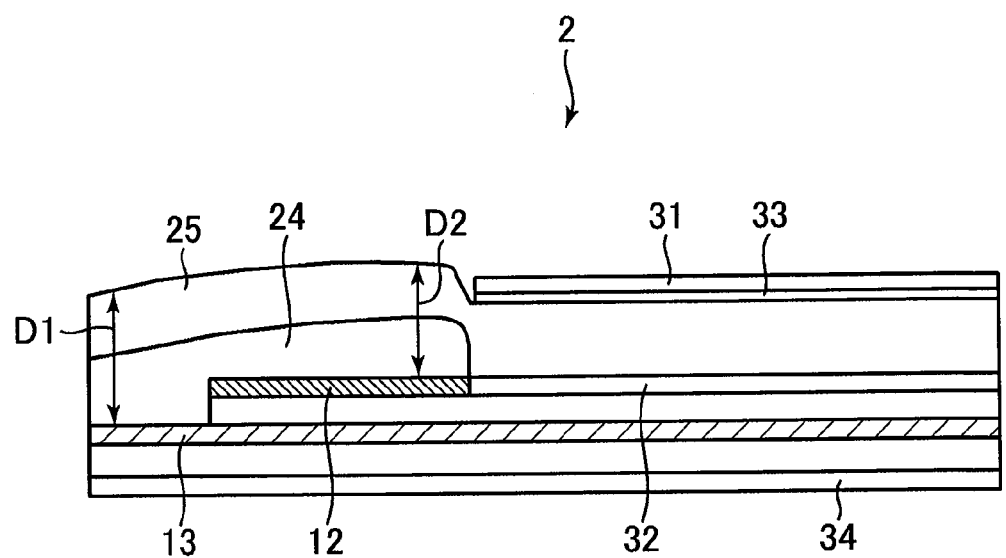
FIG. 3B is a schematic cross-sectional view illustrating the structure of the integrated semiconductor laser device according to the second embodiment of the invention.

FIG. 3B is a schematic cross-sectional view illustrating the structure of the integrated semiconductor laser device 2 according to the second embodiment of the invention. FIG. 3B shows a cross-section running through the center of an optical waveguide which extends in the transverse direction in FIG. 3A. The gain section 4 of semiconductor laser includes a multiple quantum well layer 32 in which a well layer and a barrier layer are formed using an InGaAsP-based material. The gain section 4 has a BH structure in which a mesa stripe structure which includes the multiple quantum well layer 32 is formed on an n-type InP substrate 21 and both sides of the mesa stripe structure are buried by a semi-insulating InP buried layer 24. A second p-type InP clad layer 25, a p-type contact layer 33 and a p-type electrode 31 are formed on an upper side of the mesa stripe structure, and an n-type electrode 34 is formed on a rear surface of the n-type InP substrate 21.

Similarly, an upper core layer 12 of the spot-size converter section 3 is formed using an InGaAsP-based material, and the multiple quantum well layer 32 and the upper core layer 12 are optically connected to each other due to butt joint growth to thereby form an optical waveguide. That is, an active layer of the gain section 4 of semiconductor laser which is in contact with the upper core layer 12 of the spot-size converter section 3 corresponds to the multiple quantum well layer 32. A first InP clad layer 23 is formed on the upper side of the upper core layer 12 and the multiple quantum well layer 32, but the first InP clad layer 23 is thinner than the second InP clad layer 25, and thus, is not shown in FIG. 3B.

When light propagated in the light transition region of the spot-size converter section 3 transits from the upper core layer 12 to the lower core layer 13, a mode filed of the light is widened, and light leakage occurs on the upper side of the upper core layer 12. If the mode field of the light is widened and is in contact with the p-type contact layer 33 or the p-type electrode 31 of the gain section 4, the loss is increased. Such a problem is generally prevented by increasing the thickness of the p-type clad layer which is disposed on the upper side of the multiple structure of the semiconductor laser, but in this case, device resistance of the semiconductor laser is increased to deteriorate device characteristics.

In the spot-size converter section 3 of the integrated semiconductor laser device 2 according to the present embodiment, the semi-insulating InP buried layer 24 is disposed on both sides and the upper side of the upper core layer 12, and thus, in the light transition region of the spot-size converter section 3, a semiconductor layer which is layered on the upper side of the upper core layer 12 includes plural semiconductor layers (clad layers) which includes a first InP clad layer 23, the semi-insulating InP buried layer 24 and the second InP clad layer 25, and the total thickness of these semiconductor layers (length D2) is larger (thicker) than the total thickness of the semiconductor layer (p-type clad layer) which is layered on the upper side of the multiple quantum well layer 32 which is the active layer of the gain section 4 of the semiconductor laser. Thus, without increase in the thickness of the p-type clad layer of the gain section 4 of the semiconductor laser, it is possible to avoid such a problem. In the spot-size converter section 3, on an incident end surface side and an emission end surface side thereof, the height of an upper surface of the second InP clad layer 25 is changed, but the total (length D1) of the thickness of the plural semiconductors (clad layers) which is disposed on an upper side of the lower core layer 13 in the emission light propagation region (emission end surface) and the total (length D2) of the thickness of the plural semiconductors (clad layers) which is disposed on the upper side of the upper core layer 12 in the light transition region are approximately the same, and thus, the light mode field is prevented from being widened to the gain section 4 of the semiconductor laser.

Next, a main manufacturing process of the integrated semiconductor laser device 2 according to the present embodiment will be simply described. The spot-size converter section 3 and the gain section 4 of the semiconductor laser are formed on the n-type InP substrate 21, but the layers manufactured by the common material on the same layer may be layered by the same process. As shown in FIG. 3B, since the multiple quantum well layer 32 of the gain section 4 and the upper core layer 12 of the spot-size converter section 3 have different configurations, they are separately layered. This may be similarly applied to etching, and the etching may be performed in the common process.

Further, in the burying process, the multilayer structure of the spot-size converter section 3 and the mesa stripe structure of the gain section 4 of the semiconductor laser are buried by the semi-insulating InP buried layer 24, and both sides of the mesa stripe structure of the gain section 4 is buried by the semi-insulating InP buried layer 24, to thereby form the BH structure. Further, in the clad layer forming process, the second InP clad layer 25 is layered on the upper side of the mesa stripe structure of the gain section 4, together with the spot-size converter section 3. The p-type contact layer 33 and the p-type electrode 31 are formed on the upper surface of the gain section 4, and the n-type electrode 34 is formed on the rear surface of the n-type InP substrate 21, to thereby manufacture the integrated semiconductor laser device 2.

As described above, the integrated semiconductor laser device 2 according to the present embodiment includes a process which is common in the manufacturing process, among the process of forming the spot-size converter section 3 and the process of forming the gain section 4 of the semiconductor laser. By making the manufacturing process common, it is possible to perform manufacturing while suppressing increase in the process or cost. Further, in a process where a photolithography process, an etching process and the like are individually performed in the spot-size converter section 3 and the gain section 4 of the semiconductor laser, position deviation or the like may occur, but by making the manufacturing process common, it is possible to suppress occurrence of the position deviation or the like, and to enhance the characteristics as an integrated device.

The semiconductor laser of the integrated semiconductor laser device 2 according to the present embodiment may be the Febry-Perot type laser, but may be a semiconductor laser having a different structure, for example, a DFB (Distributed Bragg Grating) laser or a DBR (Distributed Bragg Reflector) laser. Further, in the present embodiment, the optical semiconductor device is the integrated semiconductor laser device 2 in which the spot-size converter and the semiconductor laser are integrated on the same substrate, but is not limited to the semiconductor laser. That is, the spot-size converter and an optical functional device such as a semiconductor converter or a semiconductor wavelength-variable filter may be integrated on the same substrate.

Third Embodiment

An optical semiconductor device according to a third embodiment of the invention is an integrated semiconductor laser device 5 in which the spot-size converter section 3 and a wavelength-variable laser section 6 are integrated on the same semiconductor substrate. The wavelength-variable laser section 6 is a wavelength-variable laser of an LGLC (Lateral Grating assisted Co-directional Coupler) type, and a structure of the wavelength-variable laser is disclosed in "Optical Fiber Communication Conference 2011, OWD7, March, 2011".

Figure 4A:
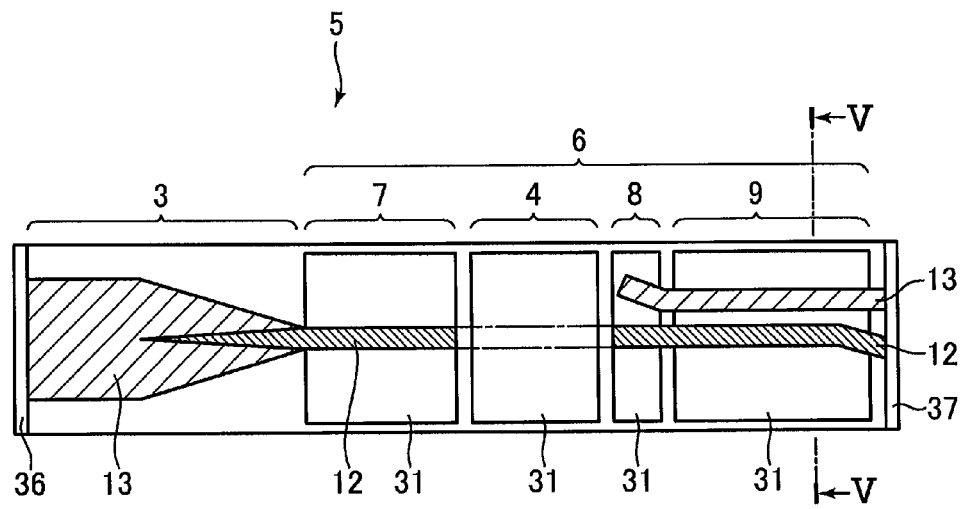
FIG. 4A is a schematic top view illustrating a structure of an integrated semiconductor laser device according to a third embodiment of the invention.

FIG. 4A is a schematic top view illustrating a structure of the integrated semiconductor laser device 5 according to the third embodiment. As shown in FIG. 4A, a DBR section 7, a gain section 4 which generates light, a phase adjusting section 8 which adjusts the phase of light, and an LGLC filter section 9 are disposed in a wavelength-variable laser section 6 of an integrated semiconductor laser device 2, in the order from a light emission side. A front end surface film 36 is formed on an emission end surface of the integrated semiconductor laser device 5, and a rear end surface film 37 is disposed on an opposite end surface thereof, respectively. The rear end surface film 37 functions as a reflection film (mirror). FIG. 4A schematically shows a planar overlap in the spot-size converter section 3 including the lower core layer 13 and the upper core layer 12 which is disposed above the lower core layer 13, when seen from the top of the integrated semiconductor laser device 5. Further, a p-type electrode 31 which is formed on each upper surface of each section of the wavelength-variable laser section 6 is shown. Further, an optical waveguide in the wavelength-variable laser section 6 is schematically shown, but the optical waveguide of the DBR section 7, the phase adjusting section 8 and the LGLC filter section 9 are the upper core layer 12 (first core layer). One more optical waveguide is formed in the LGLC filter section 9, which is the lower core layer 13 (second core layer). Here, the former corresponds to a high refractive index optical waveguide and the latter corresponds to a low refractive index optical waveguide. In the LGLC filter section 9, the high refractive index optical waveguide extends in the transverse direction, is bent in the vicinity of a rear end surface thereof, and reaches to the rear end surface film 37. On the other hand, the low refractive index optical waveguide vertically extends to the phase adjusting section 8 from the rear end surface, is bent in the vicinity of a boundary thereof, and reaches the phase adjusting section 8.

Figure 4B:
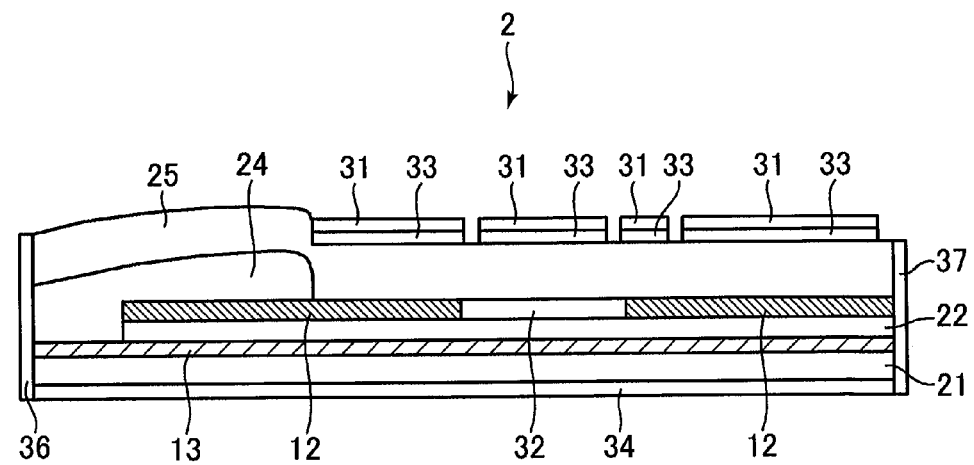
FIG. 4B is a schematic cross-sectional view illustrating the structure of the integrated semiconductor laser device according to the third embodiment of the invention.

FIG. 4B is a schematic cross-sectional view illustrating the structure of the integrated semiconductor laser device 5 according to the present embodiment. FIG. 4B shows a cross-section running through the center of an optical waveguide (high refractive index optical waveguide) which extends in the transverse direction in FIG. 4A. As described above, the high refractive index optical waveguide is bent in the vicinity of the rear end surface thereof, but since the figure shows a cross-section along the center of the optical waveguide, the upper core layer 12 and the lower core layer 13 are shown at the right end in FIG. 4B.

As shown in FIG. 4B, the lower core layer 13 extends from the rear end surface of the integrated semiconductor laser device 5 over the front end surface thereof. Further, the optical waveguide of the gain section 4 is the multiple quantum well layer 32 described above, but in portions other than this, the upper core layer 12 extends from the rear end surface to the phase adjusting section 8, and from the DBR section 7 to the optical transition region of the spot-size converter section 3.

Figure 5:
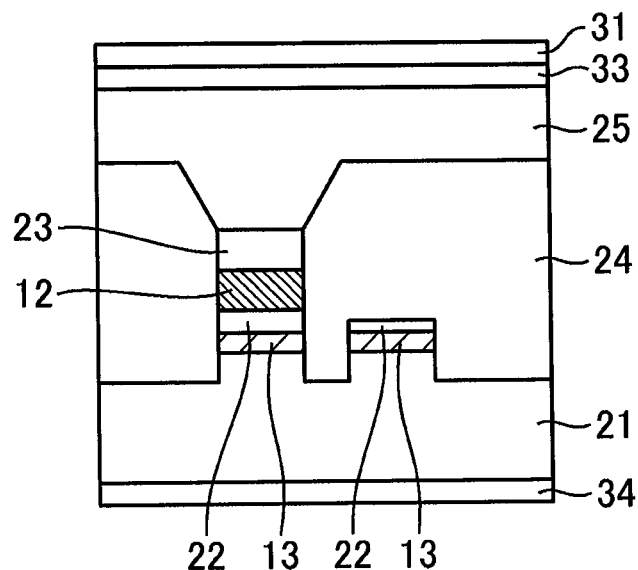
FIG. 5 is a cross-sectional view illustrating an LGLC filter section of the integrated semiconductor laser device according to the third embodiment of the invention.

FIG. 5 is a cross-sectional view illustrating the LGLC filter section 9 of the integrated semiconductor laser device 5 according to the present embodiment. The cross-section shown in FIG. 5 shows a case where a cross-section of line V-V in FIG. 4A is seen from the right in the figure. In the LGLC filter section 9, a directional coupler structure in which optical waveguides having different refractive indexes are arranged in parallel with each other is formed, and the upper core layer 12 (first core layer) of a first mesa stripe structure which is disposed on the left side of FIG. 5 corresponds to the high refractive index optical waveguide. Further, as shown in FIG. 5, a second mesa stripe structure is formed in parallel on the right side of (beside) the first mesa stripe structure is formed, and the lower core layer 13 (second core layer) of the second mesa stripe structure corresponds to the low refractive index optical waveguide. The first mesa stripe structure further includes the lower core layer 13 (second core layer), and the first mesa stripe structure includes a two-layered core layer. Further, the height of the upper surface of the second mesa stripe structure is disposed between the upper core layer 12 and the lower core layer of the first mesa stripe structure, and is lower than the lower surface of the upper core layer 12 (first core layer) of the first mesa stripe structure.

If light is incident on the high refractive index optical waveguide having a high refractive index, only light of a wavelength which satisfies a predetermined condition transits to the low refractive index optical waveguide having a low refractive index. Here, the predetermined condition corresponds to the time when the wavelength becomes "$\Lambda \times (n_h - n_l)$" (Formula 2). Here, "$\Lambda$" is a diffraction grating period of the high refractive index optical waveguide, $n_h$ is an effective refractive index of the high refractive index optical waveguide, and $n_l$ is an effective refractive index of the low refractive index optical waveguide. The diffraction grating is formed by periodically changing the width of the high refractive index optical waveguide in the propagation direction. By injecting electric current to the high refractive index optical waveguide and by changing an effective refractive index of the high refractive index optical waveguide, it is possible to control the wavelength of the transited light, and to control the transmitted wavelength as a wavelength selection filter.

The LGLC filter section 9 of the integrated semiconductor laser device 5 according to the present embodiment uses the first core layer which forms the high refractive index optical waveguide and the second core layer which forms the low refractive index optical waveguide to form the wavelength selection filter. Here, in the LGLC filter section 9, the high refractive index optical waveguide and the low refractive index optical waveguide are formed in parallel in the transverse direction, but as disclosed in "IEEE Photonics Technology Letters, vol. 5, No. 7, pp 735-738, 1993", there is a wavelength selection filter in which a high refractive index optical waveguide and a low refractive index optical waveguide are formed in parallel in the longitudinal direction. In any case, in this way, by using the optical semiconductor device in which the semiconductor device which uses the two-layered core layer and the dual mesa tapered spot-size converter having the two-layered core layer are integrated on the same substrate monolithically, it is possible to enhance the characteristics as the integrated device while suppressing increase in the manufacturing process.

The upper core layer 12 (high refractive index optical waveguide) of the first mesa stripe structure forms one optical waveguide which extends in the transverse direction in FIG. 4A in cooperation with the spot-size converter section 3, the DBR section 7, the gain section 4 and the phase adjusting section 8, as shown in FIG. 4A. In the active layer, the gain section 4 is the multiple quantum well layer 32, and the remaining portion is the upper core layer 12. Further, one optical waveguide which extends from the first mesa stripe structure is connected to the upper core layer 12 of the spot-size converter section 3, and laser light emitted by the wavelength-variable laser section 6 is incident on the upper core layer 12 of the spot-size converter section 3. That is, the upper core layer 12 (first core layer) of the first mesa stripe structure is disposed on an optical axis of the light incident on the spot-size converter section 3. The first mesa stripe structure of the LGLC filter section 9 and the mesa stripe structure of the incident end surface of the spot-size converter section 3 are the same. The mesa stripe structures of the phase adjusting section 8 and the DBR section 7 are the same. The mesa stripe structure of the gain section 4 is different from in that the active layer is the multiple quantum well layer 32, but is the same in other points. Accordingly, since the upper core layer 12 and the lower core layer 13 of the LGLC filter section 9 and the upper core layer 12 and the lower core layer 13 of the spot-size converter section 3 are respectively formed in the same process, they may be formed by the same composition. Further, the first mesa stripe structure of the LGLC filter section 9 has the same multilayer as the plural layers which includes the upper core layer 12 and the lower core layer 13 of the spot-size converter section 3, and the upper core layers 12 in both the sections may be formed on the same layer. If the multilayer of the first mesa stripe structure includes the upper core layer 12 (first core layer) which is formed with the same layer structure and the same composition as the upper core layer of the spot-size converter section 3, or may simply overlap a part of the plural layers. This is similarly applied to the lower core layer 13. Similarly, the second mesa stripe structure of the LGLC filter section 9 has the same multilayer as a part of the plural layers of the spot-size converter section 3, and the lower core layers 13 in both the sections may be formed on the same layer.

Next, a main manufacturing process of the integrated semiconductor laser device 5 according to the present embodiment will be described. FIG. 6, FIGS. 7A to 7E, and FIGS. 8A to 8E are cross-sectional views illustrating processes of a manufacturing process of the integrated semiconductor laser device 5 according to the present embodiment. Here, FIGS. 7A to 7E show cross-sections of the LGLC filter section 9, and FIGS. 8A to 8E show cross-sections in the light transition region of the spot-size converter section 3, respectively.

Figure 6:
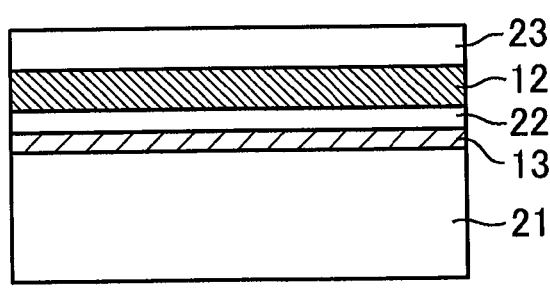
FIG. 6 is a cross-sectional view illustrating a manufacturing process of the integrated semiconductor laser device according to the third embodiment of the invention.

Firstly, a multilayer which includes the lower core layer 13, the InP etching stop layer 22, the upper core layer 12 and the first InP clad layer 23 is sequentially layered on the n-type InP substrate 21 (multilayer forming process). FIG. 6 is a cross-sectional view after the multilayer forming process and shows a cross-section of the spot-size converter section 3 and a cross-section of the LGLC filter section 9. Here, the layers manufactured by a common material on the same layer may be layered by the same process. As shown in FIGS. 4A and 4B, the upper core layer 12 is formed on the upper side of the InP etching stop layer 22 in the spot-size converter section 3, the DBR section 7, the phase adjusting section 8 and the LGLC filter section 9; and the multiple quantum well layer 32 is formed on the upper side of the InP etching stop layer 22 in the gain section 4. Here, the upper core layer 12 and the multiple quantum well layer 32 are separately layered.

Subsequently, a mesa stripe structure of each portion is formed by the multilayer formed in the multilayer forming process. Here, a process of forming a dual mesa structure of the spot-size converter section 3 corresponds to a dual mesa forming process. The process is characterized in that etching is performed in two stages. The process of forming the mesa structure of each section will be described below.

On the upper side of the first InP clad layer 23 which is the highest layer of the multilayer, a pattern mask of a predetermined shape is formed. Here, the predetermined shape includes two island shapes. One island shape corresponds to the shape of an optical waveguide from the first mesa stripe structure of the LGLC filter section 9 to the upper mesa stripe structure of the spot-size converter section 3. That is, this corresponds to two regions shown as the upper core layer 12 in FIG. 4A and the optical waveguide region (the shape of the multiple quantum well layer 32) which is schematically shown between these regions. The other island shape is a region of the second mesa stripe structure of the LGLC filter section 9 and corresponds to the shape of the lower core layer 13 shown on the upper side of the one region shown in FIG. 4A. The predetermined shape may be determined so that the upper core layer 12 becomes a desired shape by etching, using the pattern mask as a mask. Such a pattern mask is shown as a mask 41 (first mask) corresponding to the first mesa stripe structure and as a mask 41 (second mask) corresponding to the second mesa stripe structure, in FIG. 7A. Further, among these mask patterns, the region of the spot-size converter section 3 is an upper mesa mask 42 as shown in FIG. 8A, and a process of forming the upper mesa mask 42 corresponds to an upper mesa mask forming process.

Next, a lower mesa mask 43 which is formed of a different material from the upper mesa mask 42 is formed in a predetermined shape (lower mesa mask forming process) on the upper mesa mask 42. The lower mesa mask 43 is shown in FIG. 8A. The predetermined shape of the lower mesa mask 43 corresponds to the lower mesa stripe structure of the spot-size converter section 3, and corresponds to the region shown as the upper core layer 12 and the region shown as the lower core layer 13, in the region of the spot-size converter section 3 in FIG. 4A.

Subsequently, using the pattern mask which is multilayer-formed as a mask, a first stage etching is performed up to a predetermined depth. The first stage etching is a dry etching, for example. As shown in FIG. 7A, in the LGLC filter section 9, using the two masks 41 (the first mask and the second mask) as a mask, the periphery of each mask is etched up to the predetermined depth for removal. As shown in FIG. 8A, in the spot-size converter section 3, using the lower mesa mask 43 as a mask, the periphery of the lower mesa mask 43 is etched up to the predetermined depth for removal (first etching process). As shown in FIGS. 7A and 8A, the predetermined depth corresponds to the depth up to a part of the first InP clad layer 23.

After the first etching process, the lower mesa mask 43 is removed (lower mesa mask removing process). Here, since the upper mesa mask 42 and the lower mesa mask 43 are formed of different mask materials described above, etching performance with a large selection ratio of etching rate is required to remain the upper mesa mask 42.

After the lower mesa mask removing process, a second stage etching is performed using the remaining pattern mask as a mask. Here, the second stage etching is a dry etching, for example. As shown in FIG. 7B, in the LGLC filter section 9, using the two masks 41 as a mask, the periphery of the corresponding mask is etched from the predetermined depth up to the depth lower than the lower core layer 13 for removal. Through such a process, the first mesa stripe structure is formed. Further, with respect to the second mesa stripe structure, a structure is used in which the multilayer upper part to be removed in a post process is disposed on the second mesa stripe structure. As shown in FIG. 8B, in the spot-size converter section 3, using the upper mesa mask 42 as a mask, the periphery of the upper mesa mask 42 is etched up to a part of the InP etching stop layer 22 from the multilayer upper surface (upper surface of the first InP clad layer 23), that is, to between the upper core layer 12 and the lower core layer 13 for removal, to thereby form the upper mesa stripe structure. Further, by further etching the region etched up to the predetermined depth in the first etching process up to the depth which is lower than the lower core layer 13 for removal, the lower mesa stripe structure is formed (second etching process). In the second etching process, since the multilayer structure in the light transition region of the spot-size converter 3 maintains a step difference generated in the first etching process to perform etching, the upper mesa stripe structure and the lower mesa stripe structure are completed after the corresponding process. The predetermined depth in the first etching process may be determined so that when the upper mesa stripe structure is formed by etching both sides of the upper mesa stripe structure up to an intermediate part of the InP etching stop layer 22, both sides of the lower mesa stripe structure are etched up to the depth which is lower than the lower core layer 13. Here, the dual mesa structure of the spot-size converter section 3 is completed, and the dual mesa forming process is terminated.

Here, the spot-size converter section 3 and the LGLC filter section 9 are etched in the common process, and the mesa depths in both sections are the same. That is, the height of a front surface of the n-type InP substrate 21 on both sides of the mesa stripe structure of the LGLC filter section 9 and the height of a front surface of the n-type InP substrate 21 on both sides of the dual mesa structure of the spot-size converter section 3 are the same. A height D3 of the front surface of the upper core layer 12 of the first mesa stripe structure from the front surface of the n-type InP substrate 21 in the LGLC filter section 9 as shown in FIG. 7B, and a height D4 of the front surface of the upper core layer 12 from the front surface of the n-type InP substrate 21 in the spot-size converter section 3 as shown in FIG. 8B are the same. Similarly, a lower surface of the semi-insulating InP buried layer 24 which is buried on both sides of the first mesa stripe structure of the LGLC filter section 9 and a lower surface of the semi-insulating InP buried layer 24 which is buried on both sides of the dual mesa structure of the spot-size converter section 3 have the same height.

After the second etching process, the multilayer upper part remaining on the upper side of the second mesa stripe structure of the LGLC filter section 9 is removed (mesa upper part removing process). That is, by removing the mask 41 (second mask) formed corresponding to the second mesa stripe structure, performing etching for such a multilayer, and removing a part of the InP etching stop layer 22, the second mesa stripe structure is formed (FIG. 7C). A process of removing the region (upper mesa mask 42) disposed in the spot-size converter section 3 using the pattern mask of a predetermined shape (see FIG. 8C) and forming a mesa structure of each section is terminated.

After the process of forming the mesa structure of each section, the mesa structure of each section is buried by the semi-insulating InP buried layer 24 (burying process). The mask is not disposed on the upper surface of the first InP clad layer 23 of the spot-size converter section 3, and as shown in FIG. 8D, the semi-insulating InP buried layer 24 is also formed on the upper side of the first InP clad layer 23. On the other hand, since the mask 41 (first mask) is disposed on the upper surface of the first InP clad layer 23 of the first mesa stripe structure of the LGLC filter section 9, as shown in FIG. 7D, the semi-insulating InP buried layer 24 is widely formed on both sides of the first mesa stripe structure. The mask is not disposed on the upper surface of the second mesa stripe structure of the LGLC filter section 9, and in a similar way to the spot-size converter section 3, the semi-insulating InP buried layer 24 is also formed on the second mesa stripe structure.

After the burying process, the remaining pattern mask is removed and the second p-type InP clad layer 25 is layered (clad layer forming process). FIGS. 7D and 8D show a state after the clad layer forming process. Further, a p-type contact layer 33 and a p-type electrode 31 are formed on the upper surface of the semiconductor substrate, and a n-type electrode 34 is formed on the lower surface of the semiconductor substrate (electrode forming process), to thereby manufacture the integrated semiconductor laser device 5 according to the present embodiment. FIGS. 7E and 8E show a state after the electrode forming process.

Hereinbefore, the manufacturing method according to the present embodiment has been described. A characteristic of the manufacturing method according to the present embodiment is that the first mesa stripe structure (and the structure in which the multiplayer upper part is disposed on the upper side of the second mesa stripe structure) of the LGLC filter section 9 is formed in the first etching process in which the periphery of the lower mesa mask 43 is etched for removal using the lower mesa mask 43 as a mask and the second etching process in which the periphery of the upper mesa mask 42 is etched for removal using the upper mesa mask 42 as a mask, in the spot-size converter section 3. As described above, by providing the common process in the manufacturing process, it is possible to perform manufacturing while suppressing increase in the process or cost, and to enhance the characteristics as an integrated device.

Since the upper core layer 12 which is the active layer of the DBR section 7 which is disposed on the emission side of the wavelength-variable laser section 6 and the upper core layer 12 of the spot-size converter section 3 are formed by the same process, it is possible to enhance the characteristics as a device while preventing position deviation or the like at the end surface.

Next, the characteristics of the integrated semiconductor laser device 5 which is manufactured by the manufacturing method according to the present embodiment will be described. Here, the mesa widths of the upper core layer 12 and the lower core layer 13 on the incident end surface of the spot-size converter section 3 are set to 1 μm, to form only the light transition region, without the emission light propagation region disposed on the emission side in FIG. 4A. In the light transition region of the spot-size converter section 3, the mesa width of the upper core layer 12 is gradually decreased from 1 μm in the incident end surface along the emission direction, and is decreased up to any of 0.2 μm to 0.5 μm in the emission end surface. On the other hand, the mesa width of the lower core layer 13 is gradually increased from 1 μm in the incident end surface along the emission direction, and is increased up to any of 1.8 μm to 4 μm on the emission end surface. The total length of the spot-size converter section 3 (length L in the light transition region) is set to 100 μm.

Figure 9:
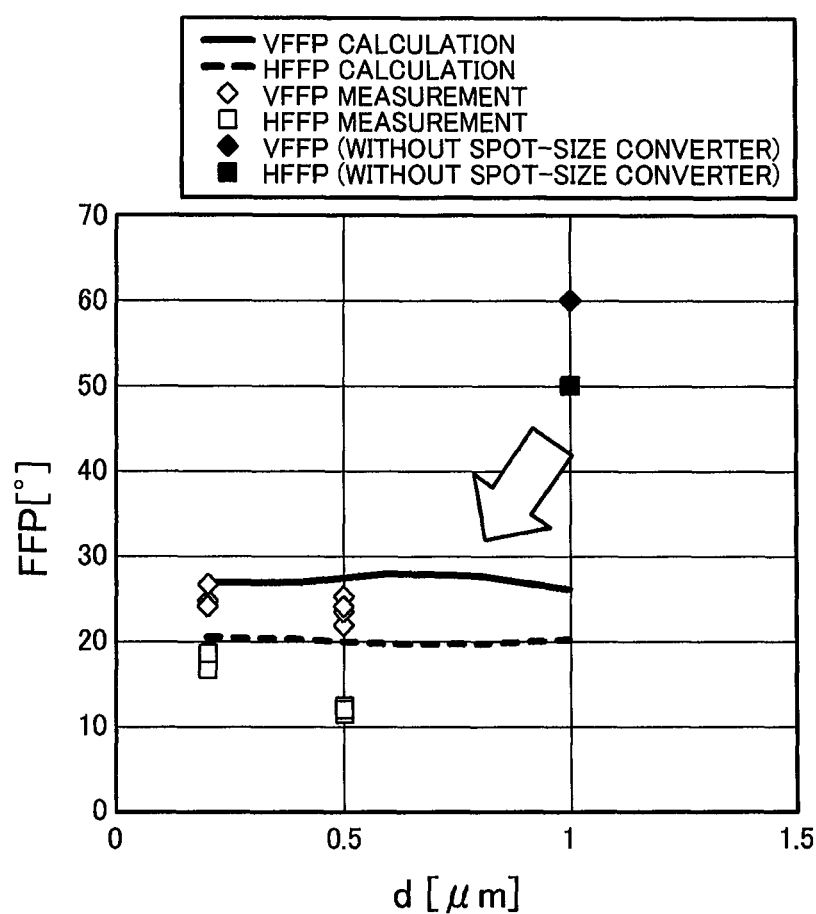
FIG. 9 is a diagram illustrating a characteristic of the integrated semiconductor laser device according to the third embodiment of the invention.

FIG. 9 is a diagram illustrating a characteristic of the integrated semiconductor laser device 5 according to the present embodiment. In FIG. 9, when the mesa width in the emission end surface of the upper core layer 12 is represented as d [μm] and the mesa width in the emission end surface of the lower core layer 13 is 1.8 μm, FFP [°] with respect to varying d [μm] of the upper core layer 12 is shown. VFFP is the FFP which is vertical (longitudinal direction: layering direction) to the semiconductor substrate, and HFFP is the FFP which is horizontal (lateral direction) to the semiconductor substrate. A calculated value of the VFFP of the integrated semiconductor laser device 5 according to the present embodiment is indicated by a solid line, a calculated value of the HFFP is indicated by a broken line, a measured value of the VFFP is indicated by a symbol ◊, and a measured value of the HFFP is indicated by a symbol □. Further, as a comparative example, with respect to an integrated semiconductor LGLC laser device in which a spot-size converter section is not provided, a measured value of the VFFP is indicated by a symbol ♦, and a measured value of the HFFP is indicated by a symbol ■.

As shown in FIG. 9, in the integrated semiconductor LGLC laser device in which the spot-size converter section is not provided, the FFP is 60° in the longitudinal direction and is 50° in the transverse direction, which are large values. On the other hand, the integrated semiconductor laser device 5 according to the present embodiment is able to reduce the FFP to about 20°. Further, since the measured value of the FFP is approximately the same as the calculated value, it can be seen that it is possible to manufacture the integrated semiconductor laser device 5 having a desired characteristic by the manufacturing method according to the present embodiment.

Generally, the transmission capacity of optical communication tends to be increased every year, and accordingly, a wavelength division multiplexing (WDM) system is practically used for a high speed and high capacity transmission technology. WDM is a system which multiplexes wavelength signal light of a wavelength interval (for example, wavelength interval of 0.8 nm or 0.4 nm) which is standardized by ITU-T (International Telecommunication Union-Telecommunication Standardization Sector) for simultaneous transmission in one optical fiber, which is capable of increasing the transmission capacity in each fiber.

Plural semiconductor laser diodes having different wavelengths (hereinafter, referred to as lasers) and a module device which drives them (hereinafter, referred to as a module) are necessary for realization of this system. In manufacturing each laser, it is necessary to make an active layer crystal-grow which becomes a composition wavelength corresponding to a wavelength of each laser, and to manufacture a module according to the wavelength of each laser. Due to increase in the manufacturing cost and complicated inventory management of the module, the module is expensive for a communication carrier or a device vender. Thus, if a wavelength-variable laser module in which the wavelength can be freely changed with one type of module is used, one type or few types of laser are sufficient, and it is thus possible to reduce the manufacturing cost and to solve the problem of inventory management. In order to realize this laser module, a wavelength-variable laser in which an oscillation wavelength is variable in a desired wavelength range (for example, a C-band or an L-band which is a general wavelength band of medium and long distance communication) is necessary. If the wavelength band of the C-band is 40 nm and a wavelength interval is 0.4 nm, it is necessary to switch-oscillate 100 types of different wavelengths from one type of laser, and wavelength controllability which is stable over a wide wavelength band is necessary in the wavelength-variable laser. Further, since the wavelength-variable laser is a replacement of a fixed wavelength laser, almost the same cost as the fixed wavelength laser is preferable, and miniaturization and low power consumption of the laser module is preferable.

The wavelength selection filter provided in the wavelength-variable laser generally uses a plasma effect due to electric current injection from the viewpoint of power consumption and wavelength variation. That is, in such a wavelength selection filter, by injecting electric current to the active layer and changing the refractive index according to the electric current amount, the wavelength of light selected by the wavelength selection filter is controlled. In "Journal of Quantum Electronics, vol. 43, No. 9, pp 798-803, 2007", a wavelength-variable laser using a wavelength selection filter of a diffraction grating type is disclosed, but in order to realize the wavelength variation of several nm by electric current injection of several tens of mA, it is necessary to change the refractive index close to 0.01. In order to assign a large refractive index change by a little electric current in this way, it is preferable to thicken the thickness of the active layer which becomes an optical waveguide of the wavelength selection filter, but if the thickness of the active layer is enlarged, this means that confinement of light in the layer thickness direction (longitudinal direction) is further enforced, and thus, the FFP in the longitudinal direction is enlarged.

Hereinbefore, as described above, the wavelength-variable laser which is provided with the wavelength selection filter in which the wavelength to be selected is controlled by electric current injection has a problem in that the confinement of light in the longitudinal direction is increased as the thickness of the active layer is increased. However, in the invention, by using the optical semiconductor device according to the present embodiment in which the spot-size converter and the wavelength-variable laser are layered on the same semiconductor substrate monolithically, a remarkable effect can be obtained. As described above, since the dual mesa tapered spot-size converter has the two-layered core layer, it is preferable that the wavelength selection filter has the high refractive index optical waveguide and the low diffractive index optical waveguide and has two-layered core layers which form the respective waveguides. It is more preferable that the wavelength selection filter be provided with the core layers having different diffractive indexes in two optical waveguides which are arranged in the transverse direction, like the LGLC filter, and thus, it is possible to make the process common in the manufacturing process by using the manufacturing method according to the present embodiment.

Further, generally, in the wavelength-variable laser, a gain section (gain) which generates light and a wavelength selection filter which has two reflection characteristics which are disposed before and after the gain section along an emission direction are disposed. Like the integrated semiconductor laser device 5 according to the present embodiment, in a case where a device such as a spot-size converter is disposed on a light emission side, it is preferable that the wavelength selection filter which is disposed in front of the gain section be a reflective wavelength selection filter which selects the wavelength of light according to its reflection characteristics, for example, DBR. On the other hand, the wavelength selection filter which is disposed at the back of the gain section may be a reflective wavelength selection filter or may be a transmissive wavelength selection filter which selects the wavelength of light according to its transmissive characteristics. In a case where the transmissive wavelength selection filter is used, by disposing a reflection film on a rear end surface of the device, it is possible to form a wavelength selection filter having a desired reflection characteristic by the transmissive wavelength selection filter and the reflection film. The LGLC filter according to the present embodiment corresponds to a transmissive wavelength selection filter. The wavelength selection filter having one reflection characteristic is formed by the transmissive wavelength selection filter and the reflection film, but the transmissive wavelength selection filter and the reflection film should not be necessarily disposed to be adjacent. That is, the transmissive wavelength selection filter and the reflection film may be disposed to adjacent to each other on the back side of the gain section, or a different device may be inserted between the transmissive wavelength selection filter and the reflection film. Further, even though the transmissive wavelength selection filter is disposed in front of the gain section, it is possible to form a wavelength selection filter having one reflection characteristic by the transmissive wavelength selection filter and the reflection film at the rear end surface. Further, by using at least one of two wavelength selection filters as a wavelength selection filter in which the wavelength to be selected is variable, the wavelength-variable laser is realized. A wavelength selection band of the wavelength selection filter in which the wavelength to be selected is variable may be wide and a wavelength selection band of the other wavelength selection filter may be narrow. In the wavelength-variable laser section 6 according to the present embodiment, the LGLC filter section 9 which is the transmissive wavelength selection filter has a wide wavelength selection band, and the DBR section 7 which is the reflective wavelength selection filter has a narrow wavelength selection band.

Fourth Embodiment

An optical semiconductor device according to a fourth embodiment of the invention has the same basic structure as that of the optical semiconductor device according to the third embodiment, and is an integrated semiconductor laser device 5 in which a spot-size converter section 3 and a wavelength-variable laser section 6 are integrated on the same semiconductor substrate. The integrated semiconductor laser device 5 according to the present embodiment is different from the third embodiment in its manufacturing method.

Figure 10A:
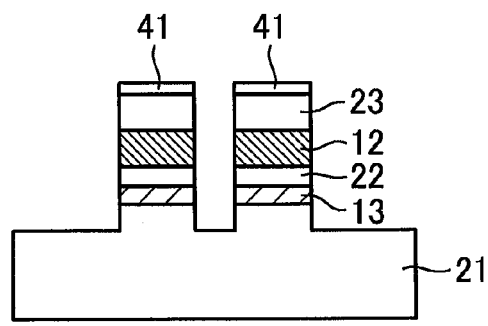
FIG. 10A is a cross-sectional view illustrating a manufacturing process of an integrated semiconductor laser device according to a fourth embodiment of the invention.
Figure 10B:
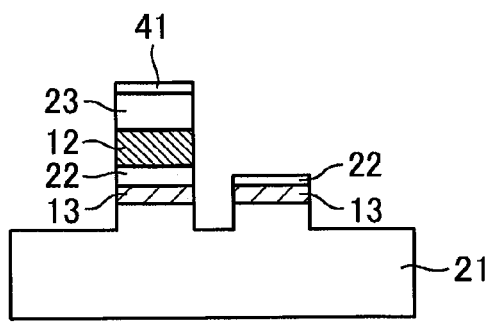
FIG. 10B is a cross-sectional view illustrating a manufacturing process of the integrated semiconductor laser device according to the fourth embodiment of the invention.
Figure 11A:
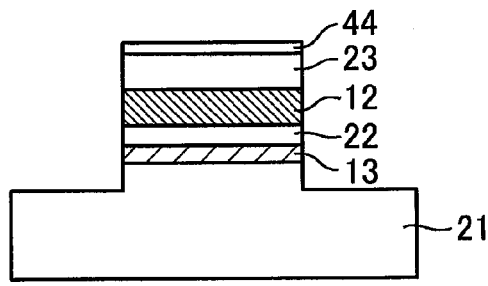
FIG. 11A is a cross-sectional view illustrating a manufacturing process of the integrated semiconductor laser device according to the fourth embodiment of the invention.
Figure 11B:
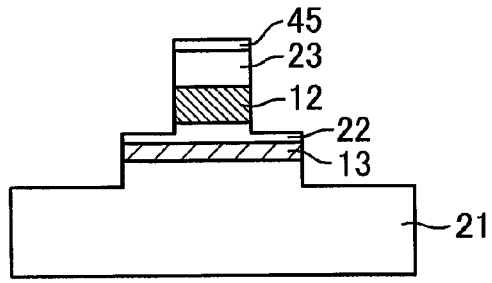
FIG. 11B is a cross-sectional view illustrating a manufacturing process of the integrated semiconductor laser device according to the fourth embodiment of the invention.
Figure 12:
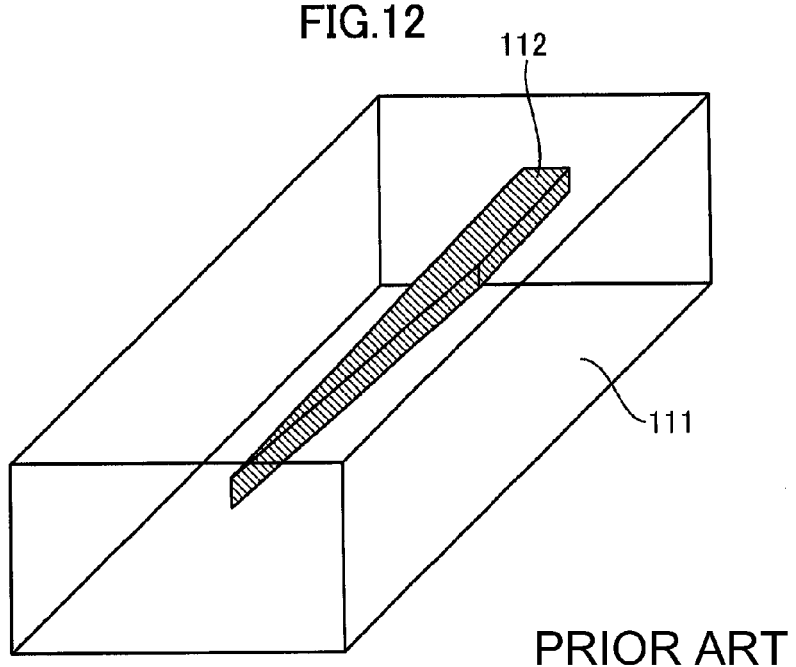
FIG. 12 is a schematic diagram illustrating a structure of a mesa width tapered spot-size converter according to the related art.
Figure 13:
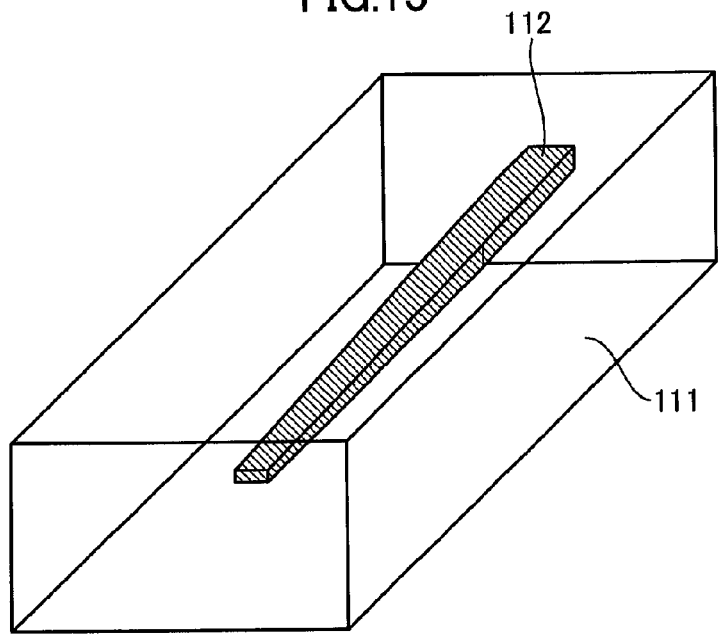
FIG. 13 is a schematic diagram illustrating a structure of a thick film tapered spot-size converter according to the related art.

A main manufacturing process of the integrated semiconductor laser device 5 according to the present embodiment will be described. FIGS. 10A and 10B and FIGS. 11A and 11B are cross-sectional views illustrating processes of a manufacturing process of the integrated semiconductor laser device 5 according to the present embodiment. FIGS. 10A and 10B show cross-sections of an LGLC filter section 9, and FIGS. 11A and 11B show cross-sections in a light transition region of the spot-size converter section 3.

A multilayer forming process of layering a multilayer on an n-type InP substrate 21 is the same as that of the third embodiment (see FIG. 6), but a process of forming a mesa stripe structure of each section by the multilayer formed in the multilayer forming process is different from that of the third embodiment. The process of forming the mesa structure of each section will be described below.

In a similar way to the third embodiment, a pattern mask of a predetermined shape is formed on an upper side of a first InP clad layer 23 which is the highest layer of the multilayer. The predetermined shape includes two island shapes. One island shape which extends from a first mesa stripe structure of an LGLC filter section 9 to a spot-size converter section 3 is different from that of the third embodiment, and the shape of a region in the spot-size converter section 3 of a pattern mask having a predetermined shape corresponds to the shape of a lower mesa stripe structure, instead of an upper mesa stripe structure. That is, in the region of the spot-size converter section 3 in FIG. 4A, the shape corresponds to a region shown as the upper core layer 12 and a region shown as the lower core layer 13, is the same region of the lower mesa mask 43 in the third embodiment. Such a mask pattern is shown as a mask 41 (first mask) corresponding to the first mesa stripe structure and as a mask 41 (second mask) corresponding to a second mesa stripe structure in FIG. 10A, in a similar way to FIG. 7A. Further, among these mask patterns, the region of the spot-size converter section 3 is shown as a lower mesa mask 44 in FIG. 11A. Differently from the third embodiment, the lower mesa mask 44 is formed in the spot-size converter section 3 using such a pattern mask (lower mask forming process).

Subsequently, using the pattern mask which is multilayer-formed as a mask, a first stage etching is performed up to a depth which is lower than the lower core layer 13. Here, the first stage etching is a dry etching, for example. As shown in FIG. 10A, in the LGLC filter section 9, using the two masks 41 (the first mask and the second mask) as a mask, the periphery of each mask is etched up to the depth which is lower than the lower core layer 13 for removal. With such a process, the first mesa stripe structure is formed, and the second mesa stripe structure becomes a structure in which a multilayer upper part to be removed in a post process is disposed on the second mesa stripe structure. That is, the state in such a process is similar to the state after the second etching process (see FIG. 7B) in the third embodiment. Further, as shown in FIG. 11A, in the spot-size converter section 3, using the lower mesa mask 44 as a mask, the periphery of the mask is etched up to the depth which is lower than the lower core layer 13 for removal (first etching process). Differently from the third embodiment, the lower core layer 13 of the lower mesa stripe structure is formed in a predetermined shape by the first etching process.

After the first etching process, by removing a part of the lower mesa mask 44 formed in the spot-size converter section 3 according to a known photolithography, an upper mesa mask 45 is formed (upper mesa mask forming process). Here, the shape of the upper mesa mask 45 corresponds to the shape of the upper core layer 12 of the spot-size converter section 3 in FIG. 4A. Here, the mask 41 (second mask) corresponding to the second mesa stripe structure of the LGLC filter section 9 is removed.

After the upper mesa mask forming process, a second stage etching is performed using the remaining pattern mask as a mask. Here, the second stage etching is a wetting etching, for example. As shown in FIG. 11B, in the spot-size converter section 3, using the upper mesa mask 45 corresponding to the upper mesa stripe structure as a mask, the periphery of the mask is etched from the upper surface of the multilayer (upper surface of the first InP clad layer 23) to a part of an InP etching stop layer 22, that is, to between the upper core layer 12 and the lower core layer 13 for removal (second etching process), to thereby form the upper mesa stripe structure. By removing such a multilayer, the lower mesa stripe structure is formed. Here, as shown in FIG. 10B, the multilayer upper part of the second mesa stripe structure of the LGLC filter section 9 is removed, to thereby form the second stripe structure. Since subsequent processes are the same as in the manufacturing process according to the third embodiment, description thereof will be omitted.

According to the characteristic of the manufacturing method according to the present embodiment, in the first etching process in which the periphery of the lower mesa mask 44 is etched for removal using the lower mesa mask 44 as a mask in the spot-size converter section 3, the first mesa stripe structure (and the structure in which the multilayer upper part is disposed on the upper side of the second mesa stripe structure) of the LGLG filter section 9 is formed, and in the second etching process in which the periphery of the upper mesa mask 45 is etched for removal using the upper mesa mask 45 as a mask in the spot-size converter section 3, the multilayer upper part of the second mesa stripe structure of the LGLG filter section 9 is removed, and thus, the number of processes is further reduced compared with the third embodiment, thereby making it possible to form the spot-size converter section 3 and the LGLC filter section 9.

Hereinbefore, the spot-size converter, the optical semiconductor device which includes the spot-size converter according to the invention, and their manufacturing methods have been described. The invention is not limited thereto, and may be widely applied.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical semiconductor device comprising:
a spot-size converter formed on a semiconductor substrate,
wherein the spot-size converter has a multilayer structure including a light transition region,
wherein the multilayer structure comprises a lower core layer and an upper core layer having a refractive index higher than that of the lower core layer,
wherein the width of the upper core layer is gradually decreased in the light transition region,
wherein the width of the lower core layer is gradually increased in the light transition region,
wherein both sides and an upper side of the multilayer structure are buried by a semi-insulating semiconductor layer in the light transition region,
wherein light incident from one end section of the spot-size converter is propagated to the upper core layer,
wherein the light transits from the upper core layer to the lower core layer in the light transition region, is propagated to the lower core layer, and is output from the other end section thereof,
wherein the semiconductor substrate is n-type, and
wherein the multilayer structure further comprises a first p-type semiconductor clad layer which is formed on an upper side of the upper core layer and a second p-type semiconductor clad layer which is formed on an upper side of the semi-insulating semiconductor layer in the light transition region.

2. The optical semiconductor device according to claim 1, further comprising:
a wavelength selection filter having a first mesa stripe structure which is disposed on an optical axis of light incident on the spot-size converter and a second mesa stripe structure which is formed in parallel to the lateral side of the first mesa stripe structure and being integrated on the semiconductor substrate monolithically,
wherein the first mesa stripe structure comprises a first core layer which is formed of the same composition as that of the upper core layer of the spot-size converter,
wherein the second mesa stripe structure comprises a second core layer which is formed of the same composition as that of the lower core layer of the spot-size converter, and
wherein an upper surface of the second mesa stripe structure is lower than a lower surface of the first core layer.

3. The optical semiconductor device according to claim 2, wherein a lower surface of the semi-insulating semiconductor layer disposed on both sides of the multilayer structure in the light transition region of the spot-size converter and a lower surface of the semi-insulating semiconductor layer disposed on both sides of the first mesa stripe structure of the wavelength selection filter have the same height.

4. The optical semiconductor device according to claim 1, further comprising:
a semiconductor laser device which comprises a mesa stripe structure including an active layer which is in contact with the upper core layer and is integrated on the semiconductor substrate monolithically,
wherein the thickness of semiconductor layer which is layered on the upper side of the upper core layer of the spot-size converter is larger than the thickness of semiconductor layer which is layered on an upper side of the active layer of the semiconductor laser device.

5. The optical semiconductor device according to claim 1, further comprising:
a wavelength selection filter which changes the refractive index of an optical waveguide by electric current to control a wavelength to be selected and is integrated on the semiconductor substrate monolithically.

6. The optical semiconductor device according to claim 5, wherein the wavelength selection filter selects the wavelength of light by light transition which occurs between a first core layer, which is formed of the same composition as that of the upper core layer of the spot-size converter, and a second core layer which is formed of the same composition as that of the lower core layer of the spot-size converter.

7. The optical semiconductor device according to claim 6, wherein a second wavelength selection filter having a selection wavelength band which is narrower than a selection wavelength band of the wavelength selection filter, a gain section which emits light, and a phase adjusting section which adjusts the phase of light are integrated on the semiconductor substrate monolithically.

8. The optical semiconductor device according to claim 1, wherein the semiconductor substrate, the semi-insulating semiconductor layer, the first semiconductor clad layer and the second semiconductor clad layer are formed of InP-based materials.

9. The optical semiconductor device according to claim 1, wherein zinc is added to the first semiconductor clad layer as a dopant, and ruthenium is added to the semi-insulating semiconductor layer as a dopant.

* * * * *